United States Patent
Lewis

(10) Patent No.: US 7,439,636 B2
(45) Date of Patent: Oct. 21, 2008

(54) DRIVER SYSTEM FOR MOSFET BASED, HIGH VOLTAGE ELECTRONIC RELAYS FOR AC POWER SWITCHING AND INDUCTIVE LOADS

(76) Inventor: James M. Lewis, 11405 Alabama Highway 33, Moulton, AL (US) 35650

( * ) Notice: Subject to any disclaimer, the term of this patent is extended or adjusted under 35 U.S.C. 154(b) by 0 days.

(21) Appl. No.: 11/702,535

(22) Filed: Feb. 6, 2007

(65) Prior Publication Data

US 2007/0133144 A1 Jun. 14, 2007

Related U.S. Application Data

(60) Division of application No. 10/989,505, filed on Nov. 17, 2004, now Pat. No. 7,230,354, which is a continuation-in-part of application No. 10/684,408, filed on Oct. 15, 2003, now Pat. No. 7,183,672, which is a continuation-in-part of application No. 10/386,665, filed on Mar. 13, 2003, now Pat. No. 7,102,253, which is a continuation-in-part of application No. 10/034,925, filed on Dec. 31, 2001, now Pat. No. 6,683,393.

(51) Int. Cl.
*H01H 47/24* (2006.01)
*H01H 47/00* (2006.01)

(52) U.S. Cl. .............. 307/117; 307/132 E; 307/132 EA

(58) Field of Classification Search .................. 307/117, 307/132 E, 132 EA
See application file for complete search history.

(56) References Cited

U.S. PATENT DOCUMENTS

| | | | |
|---|---|---|---|
| 3,748,481 A | * | 7/1973 | Wagener .................. 250/214 R |
| 4,052,623 A | | 10/1977 | Loberg |
| 4,438,356 A | | 3/1984 | Fleischer |
| 4,491,750 A | | 1/1985 | Janutka |
| 4,511,815 A | | 4/1985 | Wood |
| 4,523,251 A | | 6/1985 | Erdmann et al. |
| 4,682,061 A | * | 7/1987 | Donovan ..................... 327/434 |
| 4,709,233 A | | 11/1987 | Duval |
| 4,728,825 A | | 3/1988 | Sugayama et al. |
| 4,777,382 A | * | 10/1988 | Reingold ..................... 307/106 |
| 4,847,719 A | | 7/1989 | Cook et al. |
| 4,888,504 A | | 12/1989 | Kinzer |
| 4,900,900 A | * | 2/1990 | Shirae et al. ................. 219/501 |
| 5,003,246 A | | 3/1991 | Nadd |
| 5,418,679 A | | 5/1995 | Crane et al. |
| 5,481,219 A | | 1/1996 | Jacobs et al. |
| 5,550,412 A | * | 8/1996 | Anneser ..................... 307/125 |

(Continued)

FOREIGN PATENT DOCUMENTS

DE 4429285 12/1995

*Primary Examiner*—Michael J Sherry
*Assistant Examiner*—Michael Rutland Wallis
(74) *Attorney, Agent, or Firm*—Welsh & Flaxman LLC

(57) ABSTRACT

A method and apparatus provides for high-speed switching of high-voltage and high power MOSFET-based solid state relays. A driver for a MOSFET based, high voltage, high current electronic relay includes a current supply for actuating the switching circuit and a transformer arrangement coupled to the current supply for receiving the supply of current from the current supply. The transformer arrangement is adapted for coupling with the switching circuit for selectively applying a predetermined voltage to the switching circuit which establishes the switching circuit in switch conducting or switch isolation.

22 Claims, 13 Drawing Sheets

U.S. PATENT DOCUMENTS

| | | |
|---|---|---|
| 5,602,446 A | 2/1997 | Kolber et al. |
| 5,763,962 A | 6/1998 | Tsurumi |
| 5,784,742 A | 7/1998 | Giuliani et al. |
| 5,812,383 A | 9/1998 | Majid et al. |
| 5,894,397 A | 4/1999 | Nelson |
| 5,907,223 A | 5/1999 | Gu et al. |
| 6,107,860 A * | 8/2000 | Vinciarelli .................. 327/427 |
| 6,134,125 A | 10/2000 | Wenzel |
| 6,201,680 B1 | 3/2001 | Tokatian |
| 6,259,306 B1 | 7/2001 | Brulhart et al. |
| 6,331,794 B1 | 12/2001 | Blanchard |
| 6,339,262 B1 | 1/2002 | Igarashi et al. |
| 6,434,025 B2 | 8/2002 | Shirai et al. |
| 6,441,513 B1 * | 8/2002 | Mulhauser .................. 307/130 |
| 6,456,511 B1 | 9/2002 | Wong |
| 6,462,603 B1 | 10/2002 | Pong |
| 6,496,068 B1 | 12/2002 | Eddlemon |
| 6,535,400 B2 | 3/2003 | Bridge |
| 6,844,779 B2 * | 1/2005 | McEwen ..................... 330/59 |
| 7,130,203 B2 * | 10/2006 | Mbaye .................. 363/56.12 |

* cited by examiner

AC Polarity Signal Circuit

AC Voltage Sense Waveforms

Function Output * Negative Indicator OR Positive Indicator

State Diagram

X = "Don't Care"

DRIVER SYSTEM FOR MOSFET BASED, HIGH VOLTAGE ELECTRONIC RELAYS FOR AC POWER SWITCHING AND INDUCTIVE LOADS

CROSS REFERENCE TO RELATED APPLICATIONS

This application is a divisional of U.S. patent application Ser. No. 10/989,505, filed Nov. 17, 2004, entitled "DRIVER SYSTEM FOR MOSFET BASED, HIGH VOLTAGE, ELETRONIC RELAYS FOR AC POWER SWITCHING AND INDUCTIVE LOADS", which is now U.S. Pat. No. 7,230,354 which is a continuation-in-part of U.S. patent application 10/684,408, filed Oct. 15, 2003, entitled "MOSFET BASED, HIGH VOLTAGE, ELECTRONIC RELAYS FOR AC POWER SWITCHING AND INDUCTIVE LOADS", which is now U.S. Pat. No. 7,183,672 and which is a continuation-in-part of U.S. patent application Ser. No. 10/386,665, filed Mar. 13, 2003, entitled "MOSFET BASED, HIGH VOLTAGE, ELECTRONIC RELAYS FOR AC POWER SWITCHING AND INDUCTIVE LOADS", which is currently U.S. Pat. No. 7,102,253, and which is a continuation-in-part of U.S. patent application No. 10/034,925, filed Dec. 31, 2001, entitled "MOSFET BASED, HIGH VOLTAGE, ELECTRONIC RELAYS FOR AC POWER SWITCHING AND INDUCTIVE LOADS", which is currently U.S. Pat. No. 6,683,393.

BACKGROUND OF THE INVENTION

1. Field of the Invention

The invention relates to electronic relays. More particularly, the invention relates to MOSFET based, high voltage, electronic relays for switching AC and DC power.

2. Description of the Prior Art

Advances in solid-state switching and relay technology have made possible the replacement of many electro-mechanical switching and relay assemblies. Solid-state devices provide the power control systems in which they are incorporated with long life, quiet operation and other associated advantages.

However, those skilled in the art will appreciate the difficulties associated with the development of electronic relays that may be used for AC power switching. Prior systems have exhibited shortcomings in the manner in which they provide for quick and reliable switching required in the management of AC power sources.

In addition to prior systems failing to provide for adequate switching required in the management of AC power sources, prior relays generally employ normally open contacts as opposed to the implementation of normally closed contacts. The use of normally open contacts results from the ready availability and ease of construction of semiconductor devices that restrict the flow of electricity (isolate power) in the absence of a control voltage or current. Prior to the development of the present invention, the implementation of normally closed contacts in a solid state relay would have required the inclusion of additional power inputs; something generally considered undesirable due to the added complexity and cost of the overall relay. Some prior art applications utilize depletion-mode MOSFETs to emulate normally-closed contacts. These applications are limited to extremely low current since the depletion-mode MOSFET has an inherently high resistance (typically a few ohms to 1000 ohms) compared to power MOSFETs with resistances as low as milli ohms. For high power applications, the depletion-mode MOSFET is not sufficient for carrying the required current.

With this in mind, the present invention overcomes the shortcomings of the prior solid state devices by providing a MOSFET based, high voltage, electronic relay for AC power switching and inductive loads. The present invention further provides a MOSFET based, high voltage, electronic relay for AC power switching which incorporates normally closed contacts without the need for the addition of power inputs as well as an override/bypass switch for use in conjunction with the relay such that a operator may selectively control operation of the relay apart from the automated controls of the relay.

SUMMARY OF THE INVENTION

It is an object of the present invention to provide a method and apparatus for high-speed switching of high-voltage and high power MOSFET-based solid state relays.

It is also an object of the present invention to provide a driver for a MOSFET based, high voltage, high current electronic relay, wherein the relay includes a MOSFET switching circuit selectively switching between switch conducting and switch isolation. The driver includes a current supply for actuating the switching circuit and a transformer arrangement coupled to the current supply for receiving the supply of current from the current supply. The transformer arrangement is adapted for coupling with the switching circuit for selectively applying a predetermined voltage to the switching circuit which establishes the switching circuit in switch conducting or switch isolation.

It is a further object of the present invention to provide a switching system. The switching system includes a MOSFET based, high voltage, high current electronic relay, wherein the relay includes a MOSFET switching circuit selectively switching between switch conducting and switch isolation. A driver system is coupled to the switching circuit for controlling switching between switch conducting and switch isolation. The driver system includes a current supply providing a supply of current for actuating the switching circuit and a transformer arrangement coupled to the current supply for receiving the supply of current from the current supply and the switching circuit for selectively applying a predetermined voltage to the switching circuit which establishes the switching circuit in switch conducting or switch isolation.

Other objects and advantages of the present invention will become apparent from the following detailed description when viewed in conjunction with the accompanying drawings, which set forth certain embodiments of the invention.

DESCRIPTION OF THE PREFERRED EMBODIMENTS

Figure 1:
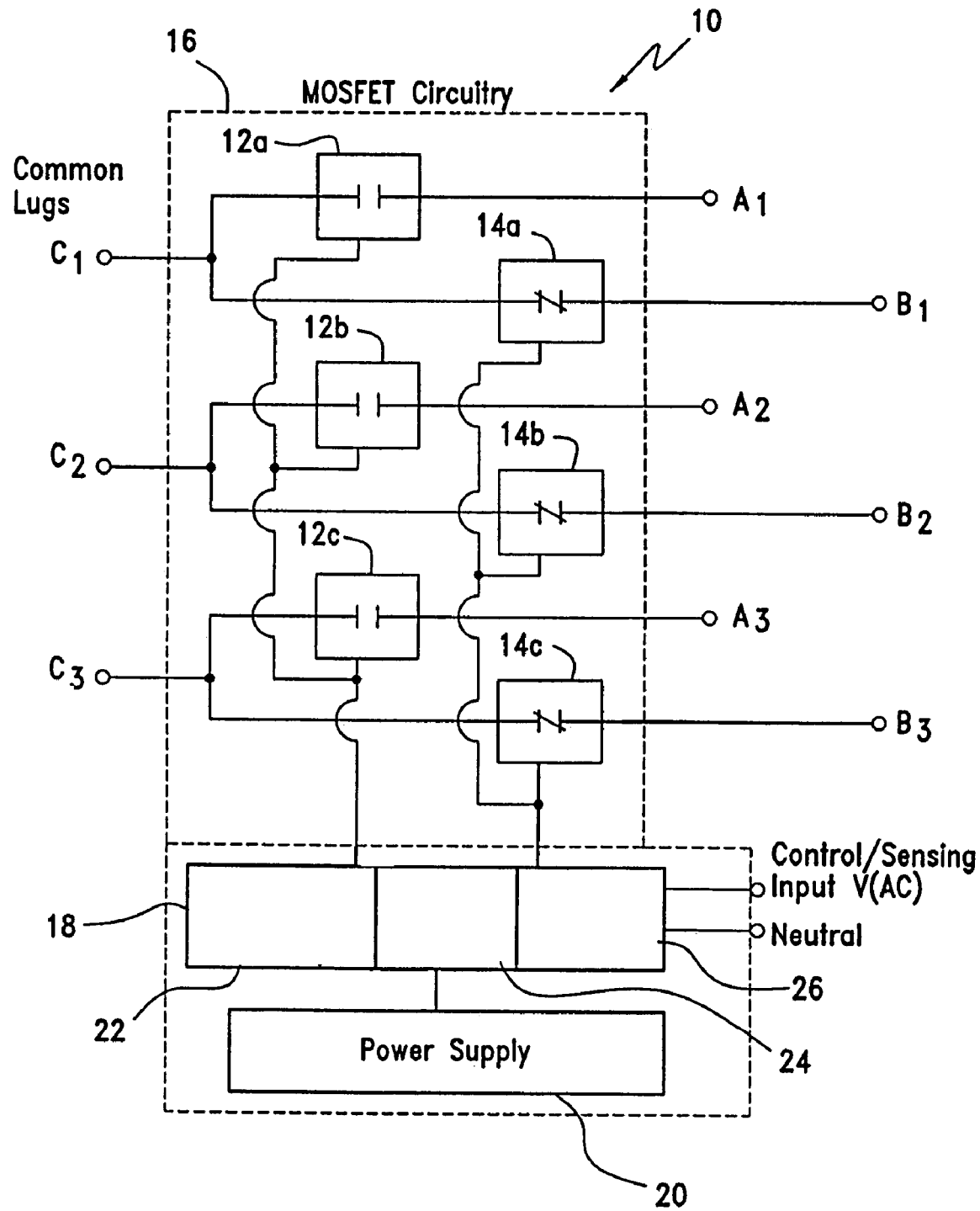
FIG. 1 is a schematic of a triple-pole, double throw system in accordance with the present invention.

The detailed embodiments of the present invention are disclosed herein. It should be understood, however, that the disclosed embodiments are merely exemplary of the invention, which may be embodied in various forms. Therefore, the details disclosed herein are not to be interpreted as limiting, but merely as the basis for the claims and as a basis for teaching one skilled in the art how to make and/or use the invention.

With reference to FIGS. 1 to 6, various embodiments of a MOSFET based, high voltage, high current AC electronic relay are disclosed in accordance with the present invention. In general, the relay includes a MOSFET switching circuit selectively switching between switch conducting (on) and switch isolation (off), a control/sensing circuitry and a power supply. The control/sensing circuitry includes an isolation transformer(s) (including a transformer driving system) coupled to each MOSFET switching circuit, a control voltage sensing circuit (for example, an oscillator circuit) linked to and controlling operation of the transformer(s) and control logic. The transformer(s) selectively applies a predetermined voltage to the MOSFET switching circuit that selectively establishes the MOSFET switching circuit in switch conducting or switch isolation.

Generally, the present invention provides novel techniques for handling the problems associated with switching AC power through the use of solid state devices. With this in mind, the present relay may be utilized in a number of possible configurations from single-pole, single-throw to multiple-pole, multiple-throw. In accordance with one embodiment of the present invention, and as disclosed in FIG. 1, the present electronic relay is applied in a three-phase relay 10 having both normally open 12a, 12b, 12c and normally closed 14a, 14b, 14c contacts. The disclosed three-phase configuration may also be referred to as a triple-pole, double-throw relay.

In addition to generally handling the problems associated with switching AC power through the use of solid state devices, the present invention also provides for the utilization of normally closed contacts (or switches) without the need for additional power inputs. As mentioned above, normally open contacts are generally easy to construct and readily available for use in conjunction with solid state relays. However, prior systems attempting to incorporate normally closed contacts into a solid state relay have been required to provide an additional power input.

As will be described below in the various embodiments of the present invention, a small amount of power is gleaned from the circuit to be controlled. In the case of relays for switching voltages (AC or DC) in accordance with the present invention, one voltage source exists that is to be switched and another voltage source is identified as the "sense voltage". When there is no voltage on the "sense voltage" inputs, the relay is said to be in the normal condition. When a certain voltage is applied to the "sense voltage" inputs, the relay is considered activated.

The power applied to the "sense voltage" inputs is used to power the operation of the relay. This is how most (if not all) solid state relays operate. The problem arises as to how one may power the normally closed parts of the circuit when no power exists at the sense voltage input. In accordance with a preferred embodiment of the present invention, and as will be discussed below in greater detail, all inputs of the relay, both switched inputs and sense inputs, are connected to rectifiers so that a voltage differential existing between any two input pins becomes a voltage source. The voltage source is used to power the relay and provide power to the normally closed contacts when no power exists at the sense voltage input. This power source also allows the relay to perform monitoring and communication functions regardless of the condition of the sense input.

The present system does not work when there are no voltages connected to any of the input pins of the relay. However, when this occurs, there is nothing to control and there is no need for the normally closed condition. As such, the inability of the relay to operate under these conditions is trivial.

As is described below with reference to the various embodiments disclosed in accordance with the present invention, the present circuit uses various combinations of systems to provide the proper operating voltage for the relay from the rectified voltage. The system typically rectifies the voltage into a high-voltage capacitor and then uses either shunt regulation or DC/DC conversion to lower the voltage to the proper operating voltage. If the voltage is too low, a step-up DC/DC power supply must be used. It is also contemplated that synchronous rectification may be used so that high voltages do not have to be dealt with. It is further contemplated that a combination transformer capacitor may be used to convert the waveform directly from the rectifier without using a high voltage capacitor. The power supply is really insignificant; it is the concept of pulling power from the circuits under control the present invention aims to achieve.

With reference to FIG. 1, the basic configuration of a triple-pole, double-throw circuit utilizing the present electronic relay is disclosed. As the schematic illustrates, the electronic relay 10 is divided into three major systems: the MOSFET switching circuitry 16 which conducts and blocks the flow of electricity, the control/sensing circuitry 18 which includes all of the analog and digital electronics permitting the relay to function in a desired a manner and the power supply 20 providing DC power to the components making up the present relay 10. As will be discussed below in greater detail, the control/sensing circuitry 18 is made up of transformer(s) and transformer driver system 22 that provides isolated gate to source voltages critical to the operation of the present relay, control voltage sensing circuits 24 and control logic 26 coordinating all activities of the various components of the control/sensing circuitry 18.

With reference to FIG. 1, the triple-pole, double-throw relay 10 includes MOSFET switching circuitry 16 (various embodiments are disclosed below for use in conjunction with various driver systems also described below) composed of a plurality of MOSFET switching circuits (i.e, open and closed contacts 12a-c, 14a-c) selectively actuated to control the flow of electricity between opposed terminals.

Figure 2:
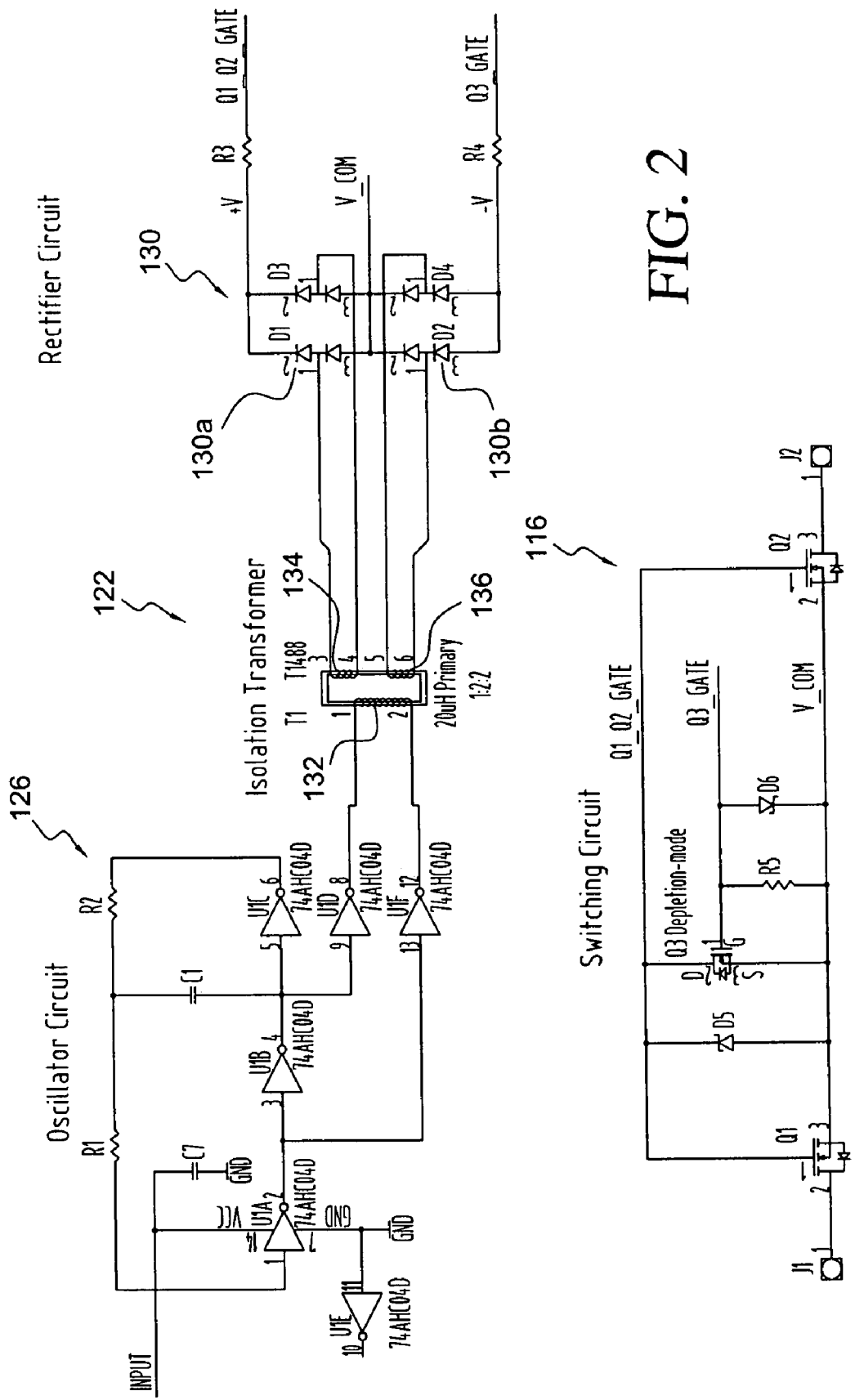
FIGS. 2, 3, 4, 5 and 6 disclose various embodiments of switching circuits and driver systems in accordance with the present invention.

Referring to FIG. 2, a schematic of a MOSFET switching circuit 116 and associated driver system 122 used in accordance with a first embodiment of the present invention are disclosed. The MOSFET switching circuit 116 includes three MOSFETs Q1, Q2, Q3. The MOSFETs are shown complete with their inherent diodes, gates, sources and drains. MOSFETs Q1 and Q2 are power MOSFETs capable of sustaining large Vds (drain to source voltages) when Vgs (gate to source voltage)=0V and are capable of conducting relatively large amounts of current with extremely low resistance and low Vds when Vgs>Threshold.

MOSFETs from a number of manufacturers have been tested for use in accordance with the present invention. In accordance with a preferred embodiment of the present invention, that is, for use in conjunction with a 480V AC relay, 1000V MOSFETs from IXYS or APT (Advanced Power Technology) are used as they are available with higher current (20 A or more) and lower on-resistance ratings. However, MOSFETs from other manufacturers, for example, On Semiconductor, International Rectifier and Harris, may be used in accordance with the present invention without departing from the spirit thereof Additionally, it is anticipated that IGBT (Integrated Gate Bipolar Transistors) may also be used in place of the power MOSFETs.

With regard to MOSFET Q3, it is a depletion-mode MOSFET. A depletion-mode MOSFET typically has from 1K ohm to a few ohms resistance between the Drain and the Source nodes when there is no voltage on the Gate. This is nice for some low power applications but does not provide much of a solution for power application requiring current flow of more than a few milli-amps. To turn off a depletion-mode MOSFET (force the MOSFET to not conduct), a negative voltage must be applied between the Gate and the Source nodes. In effect, the conducting channel must be depleted to change the behavior of the MOSFET. MOSFETs meeting the requirements of the present switching are currently available from numerous manufacturing sources, including, but not limited to, Vishay and Supertex. While specific suppliers are noted, those skilled in the art will appreciate the variety of different MOSFETs that maybe utilized in accordance with the present invention.

The present switching circuit 116 employs three MOSFETs Q1, Q2, Q3 controlled by a single isolation transformer T1 in a configuration providing for improved performance. In general, the switching circuit offers design efficiency as the component requirements are greatly reduced when the power MOSFETs Q1, Q2 are source connected. The switching circuit 116 employs a depletion-mode MOSFET Q3 between the gates and source of first and second power MOSFETs Q1, Q2. By connecting the depletion-mode MOSFET Q3 between the power MOSFETs Q1, Q2 in this manner, the power MOSFETs Q1, Q2 are forced to remain safely turned off (non-conducting) until such a time that power is applied via the oscillator circuit as described below.

Opening and closing of the switching circuit 116 is controlled by a specific driver system 122 including an oscillator circuit 126, isolation transformer T1 and rectifier circuit 130. The driver system 122 controls the MOSFET switching circuit 116 employed in accordance with a preferred embodiment of the present invention. The unique voltage relationships required by the MOSFET switching circuit 116 described above are maintained by isolating the voltage source from all other voltages. In accordance with a preferred embodiment of the present invention, a single isolation transformer 128 is utilized in applying the required isolated voltages to the MOSFET switching circuit 116.

Transformer coupled power is utilized to provide the isolated voltages required in operating the MOSFET switching circuit 116 described above. Other similar isolated power sources may also be used without departing from the spirit of the present invention.

As shown in FIG. 2, the isolation transformer T1 includes a primary winding 132 powered by the oscillator circuit 126. The primary winding 132 is connected to a first secondary winding 134 and a second secondary winding 136. Each of the first and second secondary windings 134, 136 is connected to a full bridge rectifier 130a, 130b with resistors R3, R4 associated with each of the respective rectifier circuit outputs. Operation of the present driver system 122 is enhanced by the provision of respective resistors R3, R4 between the first and second rectifiers 130a, 130b and their connections to the switching circuit 116. The provision of a resistor between the first and second rectifiers 130a, 130b and the switching circuit 116 enhances operation by limiting current flow while the first and second power MOSFETs Q1, Q2 are turning on. This is necessary because the depletion-mode MOSFET, Q3, has caused a low resistance path between the gates and sources of Q1 and Q2. If the output of the rectifier 130a is connected directly to the gate-source connection of Q1/Q2 while Q3 is still conducting, the output power of the isolation transformer will be exceeded and the circuit will never produce enough negative voltage to turn off the depletion-mode MOSFET Q3 or enough positive voltage to turn on the power MOSFETs Q1 and Q2

Because the power MOSFETs Q1, Q2 only require power while switching (enough current to charge or discharge the gates), the power delivered by the driver system 122 can be small. This minimal current requirement makes electronic relay design even more power efficient.

The rectified outputs of the rectifiers 130a, 130b of the driver system 122 are labeled with reference to their relationship to the gates of MOSFETs Q1, Q2 and Q3; that is, Q1-Q2_Gate, Q3_Gate and V-Com. When a DC supply voltage is applied to the driver system 122 at the signal labeled "INPUT", positive voltage is quickly produced on the gates of Q1 and Q2 relative to their source and a negative voltage is quickly produced on the gate of Q3 relative to its source.

Transformer coupled power is utilized in accordance with a preferred embodiment of the present invention as transformer coupling reacts relatively rapidly and is also relatively efficient. Also, transformer coupling allows for the grouping of functions while maintaining proper isolation. Transformer couplings can easily provide 1500V of isolation while quickly and efficiently coupling power so that no storage device is needed. In fact, the use of isolated power sources in accordance with the present invention, allow for response time in the range of nanoseconds.

In operation, the switching circuit 116 operates in the following manner. When power is applied to the oscillator circuit 126 (labeled "INPUT"), a negative voltage is produced at the Q3_Gate node (due to the rectified output of the second secondary winding 136 of the isolation transformer T1) and applied to the gate of the depletion-mode MOSFET Q3. This forces the depletion-mode MOSFET Q3 into "pinch-off" so that the depletion-mode MOSFET Q3 no longer conducts. When the depletion-mode MOSFET Q3 ceases conduction, positive voltage produced at node Q1-Q2_Gate (due to the rectified output of the first secondary winding 134) is allowed to pass through the resistor R3. This charges the gates of the first and second power MOSFETs Q1, Q2, forcing the first and second power MOSFETs Q1, Q2 into conduction mode (that is, the relay is on).

A resistor R3 is positioned along the Q1-Q2_Gate node and is sized to prohibit the low resistance of the depletion-mode MOSFET Q3 from saturating the isolation transformer T1. Without the resistor R3, the isolation transformer T1 is not able to overcome the low resistance of the depletion-mode MOSFET Q3. When power is removed from the oscillator circuit 126, the resistor R5 quickly dissipates the charge on the gate of the depletion-mode MOSFET Q3, so that the depletion-mode MOSFET Q3 rapidly begins conducting and eliminates the charge from the gates of the first and second power MOSFETs Q1, Q2. The resistor R5 is sized to provide minimal load to the isolation transformer T1 but to allow timely discharge of the gate voltage of the depletion-mode MOSFET Q3. Because the gate capacitance of the depletion-mode MOSFET Q3 is relatively small, a high value resistor can allow for timely discharge without placing much load on the isolation transformer T1.

Resistor R4 located between rectifiers 130b and gate of power MOSFET Q3 is of relatively low resistance and is sized for system timing and to prevent damage to MOSFET Q3 due to excessive in-rush current. It is anticipated that resistor R4 may be 0 ohms or omitted for some applications.

The present switching circuit 116 ensures that the power MOSFETs Q1, Q2 are very efficiently held in the off state for safety and control. In addition, the present driver system 122 offers simplicity by using a single isolation transformer T1 and other components. The present driver system 122 provides for power efficiency. The use of a single isolation transformer T1 means less power is required and improved voltage isolation is provided.

This switching circuit driver system 122 may be used as stand alone system or as the switching block component of a T-circuit and modified T-circuit described in U.S. Pat. No. 6,683,393, entitled "MOSFET Based, High Voltage, Electronic Relays for AC Power Switching and Inductive Loads", which is incorporated herein by reference. The circuit may be powered by the parasitic power described in other parts of this application to provide either a normally open or a normally closed switch as previously described.

Further, input power conversion in accordance with the present invention is based upon the disclosed oscillator circuit 126. The oscillator circuit 126 drives the isolation transformer T1. The resistors R1, R2 and/or capacitor C1 of the oscillator circuit 126 has an impact on the overall power demand and are selected accordingly to achieve the needs of specific applications. The ratio relationship between resistor R1/R2 and capacitor C1 determine the frequency of oscillation of the transformer driver circuit. The magnitude of the resistors R1/R2 and the capacitor C2 influence oscillator power efficiency. The preferred embodiment is sized for sufficiently high frequency to allow the use of a physically small transformer. The high speed oscillation also helps to more rapidly achieve the require gate voltages for the MOSFETs Q1, Q2, and Q3.

The combination of dual drive for the isolation transformer T1 and the transformer ratio of 1:2:2 produces gate voltages up to four times the value of the INPUT voltage. The isolation transformer dual-drive is achieved by inverter gates U1D and U1F driving the primary winding 132 of isolation transformer T1 in such a manner that primary winding 132 is alternating between a +5 volt and a −5 volt potential. This is true regardless of which node of the primary winding 132 is referenced as positive and which is referenced as negative. Because the net change in input voltage is 10 volts (5 volts−negative 5 volts) the isolation transformer T1 reacts as if it were driven with 10 volts. This provides a doubling of the potential from the INPUT voltage.

The isolation transformer T1 winding ratio of 1:2:2 (that is, each of the secondary windings 134, 136 has twice as many turns of wire as the primary winding 132) provides an additional doubling of the input voltage. The combined effect of these two techniques provides a potential of four times voltage gain to drive the gates of MOSFETs Q1, Q2, Q3. Further, the isolation transformer T1 provides isolated gate drive voltages referenced only to the MOSFET sources via the signal V-Com.

In addition, the rectifier circuit provides DC voltages to the power MOSFETs Q1, Q2 and resistor R3 prevents transformer saturation before the depletion-mode MOSFET Q3 is forced into a non-conducting state by the signal passing to Q3 Gate. The signal Q1-Q2_Gate drives the gates of the power MOSFETs Q1, Q2 and forces the MOSFETs Q1, Q2 into a conducting state (on-state). When the oscillator circuit 126 is turned off, resistor R5 quickly discharges the depletion-mode MOSFET Q3 gate charge and the depletion-mode MOSFET Q3 quickly discharges the power MOSFET gate charges. When the unit is off, the depletion-mode MOSFET Q3 ensures that Vgs of the power MOSFETs Q1, Q2 remains at zero.

The present MOSFET driver system 122 offers lower power and faster operation than photovoltaic driver circuits. The power efficiency is influenced by the resistors R1, R2 and capacitor C1 of the oscillator circuit 126, the oscillator circuit 126 frequency, the isolation transformer T1, and the turn off time set by the resistor R5. In addition, turn on time is controlled by the operating voltage, the capacitance of the power MOSFETs Q1, Q2, the oscillator circuit 126 frequency, the isolation transformer T1 drive circuit, the current limiting resistors R3, R4 and the load and output voltage (higher load=slower turn on). Finally, the turn off time is primarily controlled by resistor R5 (although the load has some effect and the capacitance of the MOSFETs Q1, Q2, Q3 has a minimal effect).

Figure 3:
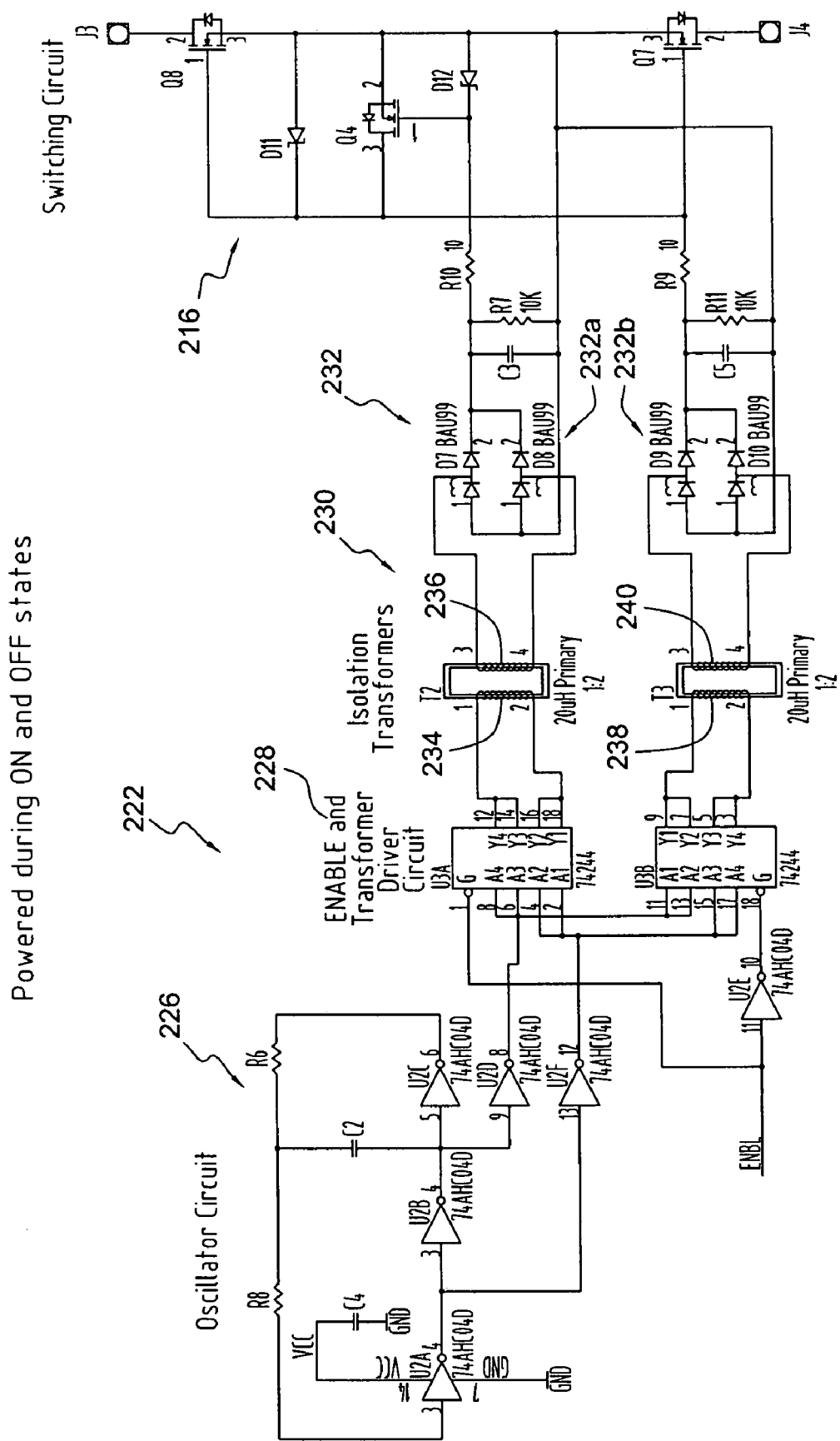

Referring to a second embodiment as disclosed with reference to FIG. 3, a schematic of a MOSFET switching circuit 216 and associated driver system 222 used in accordance with a second embodiment of the present invention is disclosed. The system offers improved performance by continually maintaining the oscillator circuit 226 on and controlling the powering of first and second isolation transformers T2, T3 under the control of an ENABLE and transformer driver circuit 228. In accordance with a preferred embodiment of the present invention, a commercially available buffer/driver IC (LS74AHC244) is used to implement the ENABLE and transformer driver circuit.

The MOSFET switching circuit 216 includes three MOSFETs Q4, Q7, Q8. The MOSFETs are shown complete with their inherent diodes, gates, sources and drains. MOSFETs Q7 and Q8 are power MOSFETs capable of sustaining large Vds (drain to source voltages) when Vgs (gate to source voltage)=0V and are capable of conducting relatively large amounts of current with extremely low resistance and low Vds when Vgs>Threshold.

As with the embodiment discussed above, MOSFETs from a number of manufacturers have been tested for use in accordance with the present invention. It is also anticipated that IGBTs may be used in place of the power MOSFETs without departing from the spirit of the present invention. In accordance with a preferred embodiment of the present invention, that is, for use in conjunction with a 480V AC relay, 1000V MOSFETs from IXYS and APT are used as they are available with higher current (20 A or more) and lower resistance ratings. However, MOSFETs from other manufacturers, for example, On Semiconductor, International Rectifier and Harris, may be used in accordance with the present invention without departing from the spirit thereof.

With regard to MOSFET Q4, it is a small-signal enhancement mode MOSFET. These MOSFETs are similar to power MOSFETs discussed above. No conduction occurs between the Drain and Source nodes when there is no voltage on the Gate node. When a positive Voltage is applied to the Gate (in reference to the Source) the conduction channel is enhanced and the MOSFET conducts electricity. The same symbol is used for power enhancement-mode MOSFETs and small-signal enhancement-mode MOSFETs. This use of the same symbol is because the two groups of MOSFETs are basically the same; the power MOSFET has more conduction channel capacity and is therefore capable of carrying more current and isolating higher voltages than its less powerful brother, the small-signal MOSFET. MOSFETs meeting these requirements are currently available from numerous manufacturing sources, including, but not limited to, Vishay, ON Semiconductor, Zetex, and Supertex. While specific suppliers are noted, those skilled in the art will appreciate the variety of different MOSFETs that may be utilized in accordance with the present invention.

The three MOSFETs Q4, Q7, Q8 of the present switching circuit 216 are controlled by a dual transformer arrangement 230 in a configuration providing for improved performance. The improved performance is derived by the application of constant power from the oscillator circuit 226 with closed and open operating conditions being determined by which of the first and second isolation transformers T2, T3 is powered. The enable signal (labeled "ENBL") determines which isolation transformer, T1 or T2, is powered. In addition, the present switching circuit 216 offers design efficiency as the component requirements are greatly reduced when the power MOSFETs Q7, Q8 are source connected. The switching circuit 216 employs a small-signal enhancement mode MOSFET Q4 between the gates and sources of first and second power MOSFETs Q7, Q8 to thereby force the power MOSFETs Q7, Q8 to remain safely turned off (non-conducting) until such a time that power is applied under the control of the enable signal ENBL and transformer driver circuit 228 as described below.

Opening and closing of the switching circuit 216 is controlled by the specific driver system 222 including the oscillator circuit 226, first and second isolation transformers T2, T3 under the control of the ENABLE and transformer driver circuit 228 (made up of U3A and U3B) and a rectifier circuit 232. As with the prior embodiments, the driver system 222 controls the MOSFET switching circuit 216 employed in accordance with a preferred embodiment of the present invention. In order to maintain the unique voltage relationships required by the MOSFET switching circuit 216 described above, the voltage source must be isolated from all other voltages.

In accordance with a preferred embodiment of the present invention, the first and second isolation transformers T2, T3 are utilized in applying the required isolated voltages to the MOSFET switching circuit 216. However, other similar isolated power sources may also be used without departing from the spirit of the present invention.

As shown in FIG. 3, the transformer arrangement 230 includes first and second isolation transformers T2, T3 applying the required isolated voltages to the MOSFET switching circuit 216. The first and second isolation transformers T2, T3 respectively turn the switching circuit 216 off under the control of the ENABLE and transformer driver circuit 228 which selectively energizes the respective first and second isolation transformers T2, T3 for actuating the switching circuit 216. It is further contemplated that a battery or charged capacitor may be used in accordance with the present MOSFET switching circuit, and the voltage may be applied or removed from the gate using optical isolation. Other similar isolated power sources may also be used without departing from the spirit of the present invention.

The first isolation transformer T2 includes a primary winding 234 connected to the oscillator circuit 226 via the ENABLE and transformer driver circuit 228 and a secondary winding 236. The secondary winding 236 is connected to a full bridge rectifier 232a with a capacitor C3 and resistor R7 on the rectifier outputs.

When the enable signal, ENBL, is logic low the driver segment labeled U3A drives transformer T2 and driver segment labeled U3B is disabled so that transformer T3 is not powered.

The second transformer T3 similarly includes a primary winding 238 connected to the oscillator circuit 226 via the ENABLE and transformer driver circuit 228 and a secondary winding 240. The secondary winding 240 is connected to a second full bridge rectifier 232b with a capacitor C5 and resistor R11 on the rectifier outputs. These rectified outputs are labeled with reference to their relationship to the gates and sources of MOSFETs. The capacitor and resistor add stability to the power MOSFETs Q7, Q8 and help limit the problems associated with parasitic charges. When the enable signal ENBL is a logic high, the U3A driver segment is disabled and the U3B driver is providing power to T3.

In use, the switching circuit 216 of the present embodiment operates by turning the system off when power is supplied to the small-signal MOSFET Q4 via the first isolation transformer T2 and turning the system on when power is supplied to the power MOSFETs Q7, Q8 via the second isolation transformer T3. This arrangement offers a variety of advantages. In particular, this embodiment is substantially similar to the embodiment disclosed with reference to FIG. 2, with the exception that the oscillator circuit 226 is always powered and operating, while the ENABLE and transformer driver circuit 228 selects which isolation transformer T2, T3 is driven for on/off operation.

In the preferred embodiment the enable function is implemented using a buffer/driver IC that allows outputs to be placed in high-impedance output when the drivers are de-selected. Using an inverter coupled to the ENBL signal allows one set of drivers and its associated transformer to be active when the ENBL signal is logic high and the other drivers and transformer to be active when the ENBL signal is logic low.

As with the embodiment disclosed with reference to FIG. 2, the isolation transformers T2, T3 provide isolation and gate voltages referenced only to the source and the rectifier circuit provide DC voltages to drive the power MOSFETs Q7, Q8. The first isolation transformer T2 provides isolation and Vgs to turn the system "off". When the first isolation transformer T2 is energized under the control of the ENABLE and transformer driver circuit 228, the small-signal MOSFET Q4 is biased into conduction and causes Vgs of the power MOSFETs Q7, Q8 to be zero. Turning off of the switching circuit 216 is, therefore, fast since the small signal MOSFET Q4 does not require much charge to switch and the oscillating circuit 226 is always providing power with the requisite charge being quickly applied to the first isolation transformer T2 under the control of the ENABLE and transformer driver circuit 228.

Because the oscillator circuit 226 is always operating, there is no delay in waiting for oscillation to start. When this oscillation circuit 226 is started, there is a short delay before oscillation is achieved. The circuit in FIG. 3 eliminates this delay by keeping the oscillator operating. There is a slight delay (nano seconds) associated with switching the driver IC, but this is minimal compared to the time to achieve stabilized oscillation.

The second isolation transformer T3 provides isolation and Vgs voltage to turn the switching circuit 216 "on" by directly driving the gates of the power MOSFETs Q7, Q8. Switching is faster than with regard to the embodiment disclosed with regard to FIG. 2 because the oscillator circuit 226 is already running and there is no delay waiting for the small signal MOSFET Q4 to turn off. The signal Q7-Q8_Gate drives the gates of the power MOSFETs Q7, Q8, and forces the power MOSFETs Q7, Q8 into a conducting on-state.

The gate discharge resistors R7, R11 and additional Vgs capacitance (C3, C5) help keep the MOSFET gates discharged when the system is unpowered. This provides unpowered safety that is inherently provided by the depletion-mode MOSFET Q3 of the embodiment described with reference to FIG. 2.

Figure 4:
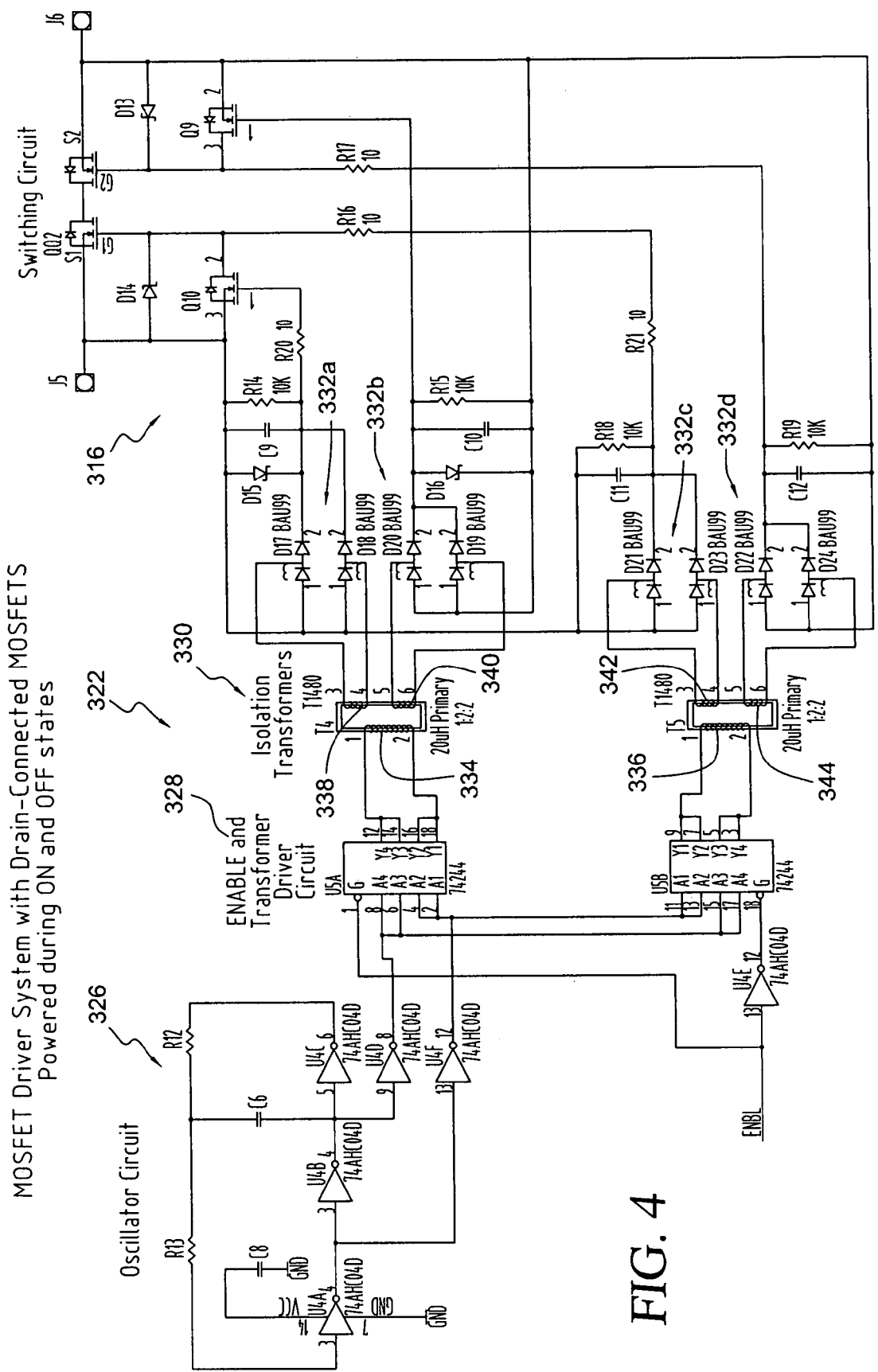

In accordance with yet a further embodiment, FIG. 4 depicts a drain connected version of the embodiment described with reference to FIGS. 3. The MOSFET switching circuit 316 of this embodiment includes four MOSFETs QQ2, Q9, Q10. The MOSFETs are shown complete with their inherent diodes, gates, sources and drains. MOSFETs QQ2 are power MOSFETs capable of sustaining large Vds (drain to source voltages) when Vgs (gate to source voltage) equals 0V and are capable of conducting relatively large amounts of current with extremely low resistance and low Vds when Vgs is greater than threshold.

The power MOSFETs QQ2 are drain connected with their respective sources connected directly to the opposed nodes through which the current is selectively flowing. As with the prior embodiments, MOSFETs from a number of manufactures have been tested for use in accordance with the present invention. In accordance with a preferred embodiment of the present invention, that is, for use in conjunction with a 480 volt AC relay, 1,000 volt MOSFETs from IXYS and APT are used as they are available with higher current (20 amp or more) and lower resistance ratings. However, MOSFETs from other manufactures, for example, On Semiconductor, International Rectifier and Harris, may be used in accordance with the present invention without departing from the spirit thereof With regard to small-signal MOSFETs Q9, Q10, they have been selected for speed, low capacitance, low resistance and small size. The Vds of these devices need not be over 20 volts and the IDS (drain two source current) may be in the MA range. MOSFETs meeting these requirements are currently available from numerous manufacturing sources including but not limited to Vishay, Zetex, and Supertex. While specific suppliers are noted, those skilled in the art will appreciate that a variety of different MOSFETs may be utilized in accordance with the present invention.

The present switching circuit 316 is designed using a pair of small-signal MOSFETs Q9, Q10 that are conducting when power is applied to the switching circuit 316 via the first isolation transformer T4. The small-signal MOSFETs Q9, Q10 are used to rapidly switch the system "off" (non-conducting) when the first isolation transformer T4 is enabled by the ENABLE and transformer driver circuit 228 (elements U5A and U5B). Capacitors C11 and C12 and resistor R18 and R19 guarantee safe operation when the system is powered down. This technique results in a system with fast switching times and lower power requirements.

The power MOSFETs QQ2 are forced into conducting mode (turned on) when isolation transformer T5 is enabled by the ENABLE and Transformer Driver circuit 228 (U5A and U5B) and isolation transformer T4 is unpowered (as above with the system described in FIG. 3)

With reference to the present MOSFET driver system 322 with drain connected MOSFETs QQ2, it also employs an oscillator circuit 326, an isolation transformer arrangement 330 with first and second isolation transformers T4, T5 under the control of an ENABLE and transformer driver circuit 328, rectifiers 332a-d and a switching circuit 316. As with the prior embodiment, the oscillator circuit 326 is always on and the ENABLE and transformer driver circuit 328 controls the supply of power to the first and second isolation transformers T4, T5.

Briefly, the first isolation transformer T4 powers the small-signal MOSFETs Q9, Q10 to turn off the switching circuit 316 upon the passage of energy therethrough. The second isolation transformer T5 powers the power MOSFETs QQ2 and turns on the switching circuit 316 upon the passage of energy therethrough.

Because the power MOSFETs QQ2 are drain connected, the sources of the respective power MOSFETs are connected to nodes J5, J6 which may have different voltages requiring that the sources of the power MOSFETs QQ2 be supplied with distinct voltages to properly reference the voltages at the nodes J5, J6. Application of distinct reference voltages to the respective power MOSFETs QQ2 and depletion-mode MOSFETs Q9, Q10 is achieved through the utilization of first and second isolation transformers capable T4, T5 of offering distinct voltages to the MOSFETs QQ2, Q9, Q10 in a manner dictated by the different voltages at the nodes J5, J6.

More particularly, each of the first and second isolation transformers T4, T5 includes a primary winding 334, 336 connected to the ENABLE and transformer driver circuit 328 and the oscillator circuit 326, a first secondary winding 338, 340 and a second secondary winding 342, 344. Each of the first and second secondary windings 338, 340, 342, 344 is connected to a full bridge rectifier 332a-d with capacitors C9, C10, C11, C12 on the rectifier outputs.

When an AC source is applied to the first isolation transformer T4 under the control of the ENABLE and transformer driver circuit 328, positive voltage is quickly produced on each gate of the small-signal MOSFETs Q9, Q10 relative to its source. Similarly, when an AC source is applied to the second isolation transformer T5 under the control of the ENABLE and transformer driver circuit 328, positive voltage is quickly produced on each gate of the power MOSFETs QQ2 relative to its source. The transformer arrangement 330 also includes capacitors C9, C10, C11, C12 that add stability to the power MOSFETs QQ2 and help limit the problems associated with parasitic charges.

In use, when the second isolation transformer T5 is turned off and the first isolation transformer T4 is turned on under the control of the ENABLE and transformer driver circuit 328, the gates of small-signal MOSFETs Q9, Q10 charge rapidly, since there is little capacitance. The speed of charging is further enhanced because the oscillator circuit 326 is always on and power is supplied to the first isolation transformer T4 upon actuation of the ENABLE and transformer driver circuit 328. When the gates of the small-signal MOSFETs Q9, Q10 are sufficiently charged, the small-signal MOSFETs Q9, Q10 discharge the Vgs voltage of the drain connected, power mode MOSFETs QQ2, turning the main power of the MOSFET switching circuit 316 off and holding it off by providing a low resistance between the gate and source of power MOSFETs QQ2. The small-signal MOSFETs Q9, Q10 are less susceptible to capacitive parasitics and so do not require additional capacitance to protect them from such effects. Since the small-signal MOSFETs Q9, Q10 have much lower capacitance, the gate charge of the power MOSFETs QQ2 will drain quickly when the second isolation transformer T5 is turned off and the first transformer T4 is turned on. In addition, system efficiency may be improved by providing the small-signal MOSFETs Q9, Q10 with high resistance at their respective gate to source resistors.

More particularly, when the first isolation transformer T4 is energized under the control of the ENABLE and transformer driver circuit 328, the small-signal MOSFETs Q9, Q10 are biased into conduction, causing Vgs of the power MOSFETs QQ2 to be zero. Turning off of the switching circuit 316 is, therefore, fast since the small-signal MOSFETs Q9, Q10 do not require much charge to switch. The second isolation transformer T5 provides isolation and Vgs voltage to turn the system "on" by directly driving the gates of the power MOSFETs QQ2 with reference to the distinct voltages required at the nodes and sources.

Switching in accordance with this embodiment is faster than the embodiment disclosed with regard to FIGS. 2, because the oscillator circuit 326 is already running and there is no delay waiting for the depletion-mode MOSFETs to pinch off. The signal QQ2-Gate drives the gates of the power MOSFETs QQ2, and forces the power MOSFETs QQ2 into a conducting state on-state. The gate discharge resistors R16, R17 and additional Vgs capacitance help keep the MOSFET gates discharged when the system is unpowered.

Operation of the disclosed transformer system 330 is enhanced by the provision of respective resistors R14, R15, R18, R19 between the first and second rectifiers 332a, 332b, 332c, 332d and their respective capacitors C9, C10, C11, C12 for each isolation transformer T4, T5. The provision of a resistor between the first and second rectifiers enhances operation by limiting current flow while small-signal MOSFETs Q9, Q10 are turning off. Because the MOSFETs only require power while switching (enough current to charge or discharge the gates), the power delivered by the first and second isolation transformers T4, T5 can be small. For example, the inventor has used a 5V CMOS circuit as a driver for the transformers. This minimal current requirement makes electronic relay design even more power efficient.

Transformer coupled power is utilized in accordance with a preferred embodiment of the present invention as transformer coupling reacts relatively rapidly and is also relatively efficient. Also, transformer coupling allows for the grouping of functions while maintaining proper isolation. It is anticipated the basic circuit can be implemented using a photovoltaic device (such as the Clare FDA215 or the Vishay LH1262C photovoltaic drivers) to drive the MOSFETs instead of the transformer coupled system. However, it should be appreciated that the transformer coupled circuit substantially improves (reduces) the switching time of the photovoltaic driven system.

Figure 5:
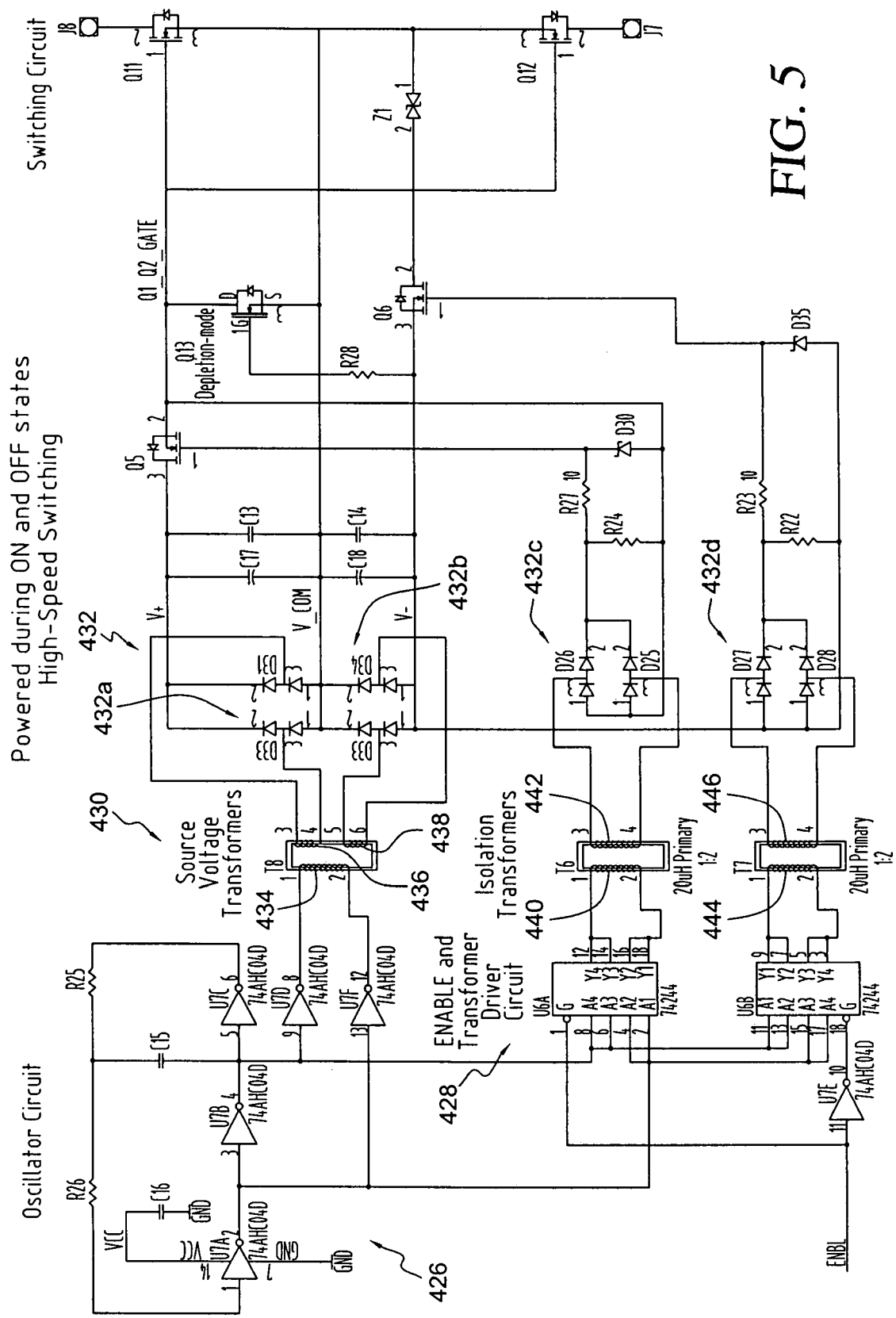

With reference to FIG. 5 a further embodiment of the present invention is disclosed. This embodiment provides a MOSFET driver system 422 that is continually powered during on and off states and provides high speed switching. As with the earlier embodiments, the system 422 includes an oscillator circuit 426, a plurality of isolation transformers T6, T7, T8 and rectifiers 432a-d linked to a switching circuit 416. In general, this embodiment employs substantially the same oscillator circuit as described above with regard to the embodiments shown in FIGS. 3 and 4. The oscillator circuit 426 is always operating whether the MOSFET switching circuit 416 is conducting ("on" state) or high impedance ("off" state).

The MOSFET switching circuit 416 includes five primary MOSFETs Q5, Q6, Q11, Q12, Q13. The MOSFETs are shown complete with their inherent diodes, gates, sources and drains. MOSFETs Q11 and Q12 are power MOSFETs capable of sustaining large Vds (drain to source voltages) when Vgs (gate to source voltage)=0V and are capable of conducting relatively large amounts of current with extremely low resistance and low Vds when Vgs>Threshold.

As with the embodiment discussed above, MOSFETs from a number of manufacturers have been tested for use in accordance with the present invention. In accordance with a preferred embodiment of the present invention, that is, for use in conjunction with a 480V AC relay, 1000V MOSFETs from IXYS are used as they are available with higher current (20A or more) and lower resistance ratings. However, MOSFETs from other manufacturers, for example, On Semiconductor, International Rectifier and Harris, may be used in accordance with the present invention without departing from the spirit thereof.

With regard to MOSFET Q13, it is a depletion-mode MOSFET. MOSFETs meeting these requirements are currently available from numerous manufacturing sources, including, but not limited to, Vishay and Supertex. While specific suppliers are noted, those skilled in the art will appreciate the variety of different MOSFETs that may be utilized in accordance with the present invention.

As for MOSFETs Q5 and Q6, they are small-signal MOSFETs (like the small-signal enhancement-mode MOSFETs utilized in FIGS. 3 and 4). These MOSFETs operate similarly to power MOSFETs Q11 and Q12 but have a much smaller gate capacitance and therefore require much less charge (and less time) to activate. Q13 is a depletion-mode MOSFET similar to the depletion-mode MOSFET Q3 in FIG. 2.

The five MOSFETs Q5, Q6, Q11, Q12, Q13 of the present switching circuit 416 are controlled by a multi-transformer arrangement 430 in a configuration providing for improved performance. The improved performance is derived from the application of constant power from the oscillator circuit 426 with closed and open operating conditions being determined by which of the isolation transformers T6, T7, T8 is powered. In addition, the present switching circuit 416 offers design efficiency as the component requirements are greatly reduced when the power MOSFETs Q11, Q12 are source connected.

The switching circuit 416 employs a depletion-mode MOSFET Q13 between the gates and sources of the first and second power MOSFETs Q11, Q12 to thereby force the power MOSFETs Q11, Q12 to remain safely turned off (non-conducting) until such a time that power is applied via the first isolation transformer T8. It is important to note that first isolation transformer T8 is not controlled by the ENABLE and transformer driver circuit (as is the case with isolation transformers T6 and T7) but is always powered when the oscillator circuit is running. Depletion-mode MOSFET Q13 ensures safety when the relay system is not powered and is always "pinched-off" when the relay is powered and therefore does not contribute to the switching of the relay but only to system safety.

Further, the first isolation transformer T8 is always operating when the relay system is powered and always providing charge to capacitors C13, C14, C17, and C18 through rectifiers 432a and 432b. These capacitors are of sufficient capacitance to provide charge to the gates of power MOSFETs Q11 and Q12 without significant voltage droop.

Opening and closing of the switching circuit 416 is controlled by a specific driver system 422 including the oscillator circuit 426, second and third isolation transformers T6, T7 and a rectifier circuit 432c and 432d. As with the prior embodiments, the driver system controls the MOSFET switching circuit 416 employed in accordance with a preferred embodiment of the present invention. In order to maintain the unique voltage relationships required by the MOSFET switching circuit 416 described above, the voltage source must be isolated from all other voltages.

Generally, the first isolation transformer T8 is used to power the system by pumping sufficient voltage to load the various capacitors C13, C14, C17, C18 employed in accordance with this embodiment. The capacitors are charged well above the threshold voltage of the MOSFETs. Thereafter, the second and third isolation transformers T6, T7 are used to turn the switching circuit 416 off and on under the control of the ENABLE and transformer driver circuit 428. When the second isolation transformer T6 is energized, small-signal MOSFET Q5 conducts so that the gates of power MOSFETS Q11 and Q12 are quickly charged and forced into conducting mode (the relay is turned on). When the third isolation transformer T7 is energized, small-signal MOSFET Q6 conducts so that the gates of power MOSFETs Q11 and Q12 are quickly discharged and the relay system is turned. Because the small-signal MOSFETs Q5 and Q6 have a small gate capacitance and switch quickly and the charge stored in capacitors C13, C14, C17, and C18 is many times greater that what is required to charge the gates of power MOSFETs Q11 and Q12, switching is very fast (on the order of a micro second or less).

The first isolation transformer T8, or source voltage transformer, includes a primary winding 434 powered by the oscillator circuit 426. The primary winding 434 is connected to a first secondary winding 436 and a second secondary winding 438. Each of the first and second secondary 436, 438 windings are connected to a full bridge rectifier 432a, 432b with capacitors C13, C14, C17, C18 associated with each of the respective rectifier circuit outputs.

The second and third isolation transformers T6, T7 are utilized in applying the required isolated voltages to the MOSFET switching circuit 416 for turning the switching circuit 416 on and off. Transformer coupled power is utilized to provide the isolated voltages required in operating the MOSFET switching circuit 416 described above. Other similar isolated power sources may also be used without departing from the spirit of the present invention. For example, it is further contemplated that a battery or charged capacitor may be used in accordance with the present MOSFET switching circuit, and the voltage may be applied or removed from the gate using optical isolation. Other similar isolated power sources may also be used without departing from the spirit of the present invention.

The second isolation transformer T6 includes a primary winding 440 connected to an oscillator circuit 426 via the ENABLE and transformer driver circuit 428 and a secondary winding 442. The secondary winding 442 is connected to a full bridge rectifier 432c with resistors R24, R27 on the rectifier outputs. These rectified outputs ate labeled with reference to their relationship to the gates and sources of MOSFETs.

The third transformer T7 similarly includes a primary winding 444 connected to an oscillator circuit 426 via an ENABLE and transformer driver circuit 428, and a secondary winding 446. The secondary winding 446 is connected to a second full bridge rectifier 432d with resistors on the rectifier outputs. These rectified outputs are labeled with reference to their relationship to the gates and sources of the MOSFETs. The resistors R22, R23 add stability to the power MOSFETs Q11, Q12 and help limit the problems associated with parasitic charges.

In operation, the first isolation transformer T8 is used to provide a source voltage for the switching operation. The rectifier diodes D31, D32, D33, D34 of the full bridge rectifier 432a, 432b associated with the first isolation transformer T8 rectify the output of the first transformer into V+, V−, V_com outputs. The various capacitors C13, C14, C17, C18 associated with the first isolation transformer T8 and the rectifiers 432a, 432b associated therewith are utilized in storing electrical potential for reasons described below in greater detail. The V-com output is directly connected to the source node of both power MOSFETs Q11, Q12. As such, all switching voltages are referenced to V-com and to the source nodes of the power MOSFETs Q11, Q12.

Initially, when the system is unpowered, the depletion-mode MOSFET Q13 keeps the power MOSFETs Q11, Q12 safely biased off by providing a low impedance gate to source path. Upon initial powering of the system via the first isolation transformer T8, a negative voltage potential is produced on the V−signal (through resistor R28). This causes the depletion-mode MOSFET Q13 to "pinch off" such that the power MOSFETs Q11, Q12 can ultimately be switched by operation of the second and third isolation transformers T6, T7.

That is, the absence of power to first isolation transformer T8 provides isolation and Vgs (of MOSFETs Q11 and Q12) to turn the system "off". Prior to the T8 transformer providing power the depletion-mode MOSFET Q13 is biased into conduction, causing the Vgs of the power MOSFETs Q11, Q12 to be zero. When T8 provides a negative voltage to the gate of the depletion-mode MOSFET Q13, Q13 is biased out of conduction (pinched off), allowing the Vgs of the power MOSFETs Q11, Q12 to be dictated by other voltages.

When it is desired to place the switching circuit 416 in conducting, or on, mode, the ENABLE and transformer driver circuit 428 is forced high and the second transformer T6 is energized (or driven). This results in a positive Vgs on small-signal MOSFET Q5. As small-signal MOSFET Q5 conducts, the positive charge stored in capacitors C13 and C17 (due to the constant power source supplied through the first isolation transformer) is discharged to the gates of the power MOSFETs Q11, Q12, allowing the power MOSFETs Q11, Q12 to rapidly charge. This places the switching circuit 416 in an on state.

When the enable signal of the ENABLE and transformer driver circuit 428 is switched and forced low, the third isolation transformer T7 is energized (the second isolation T6 transformer is simultaneously deenergized). Energizing the third isolation transformer T7 causes small-signal MOSFET Q6 to conduct, while MOSFET Q5 stops conducting due to discharge by resistor R24. As small-signal MOSFET Q6 conducts with small-signal MOSFET Q5 off, a negative charge from capacitors C14 and C18 (supplied via the constant energy source from the first isolation transformer T8) is applied to the gates of the powered MOSFETs Q11, Q12. The application of negative charge to the gates of the power MOSFETs Q11, Q12 forces the power MOSFET Q11, Q12 to turn off rapidly.

Operation of the present switching circuit 416 is enhanced by providing low value current limiting resistors between MOSFET Q5, MOSFET Q6 and the Q11-Q12 Gate node. The MOSFETs are protected by the stable voltage in the storage capacitors C13, C14, C17, C18, the close placement of all components in the circuit (to eliminate inductive affects) and the use of a dual zener (Z1). As those skilled in the art will appreciate, resistors R22 and R24 are sized to rapidly discharge the gates of MOSFET Q5 and MOSFET Q6 without adding excessive load to the isolation transformers. The small signal MOSFETs typically have a much lower gate capacitance than the power MOSFETs allowing switching to take place much more rapidly than in previous circuits in FIGS. 2-4.

Figure 6:
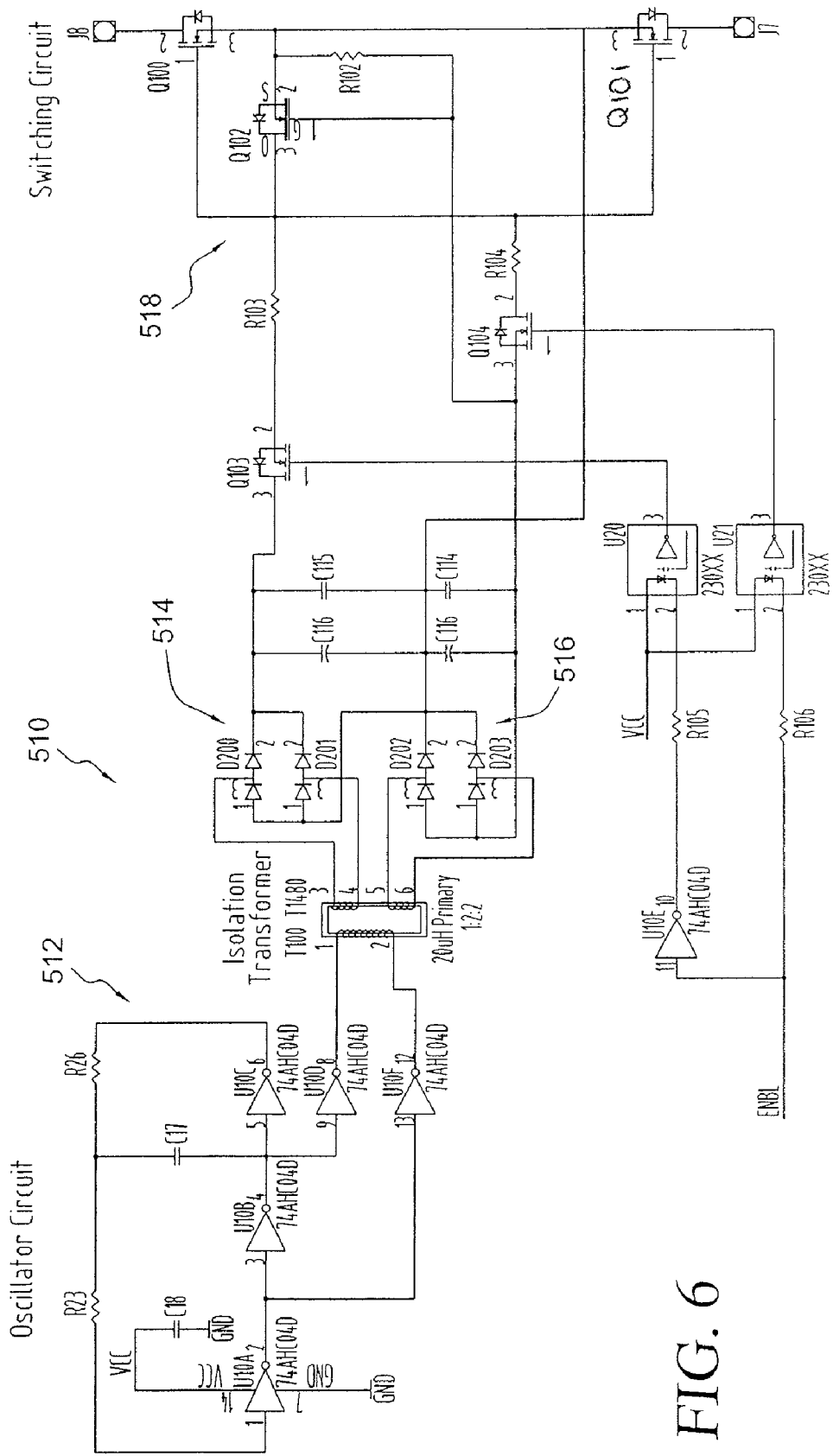

Referring to FIG. 6 a further embodiment in accordance with the present invention is shown. More particularly, a system 510 composed of a MOSFET switching circuit 518 with isolated power and optical switching is disclosed. The present system 510 and switching circuit 518 operates exactly like the circuit in FIG. 5 except that the transformer driver circuit and two of the isolation transformers used in accordance with the embodiment disclosed with reference to FIG. 5 have been replaced with first and second high speed optoisolators U20 and U21. The first and second high speed optoisolators U20, U21 are powered from the capacitors C113, C114, C115, and C116 and have their outputs referenced to the source node of the respective first and second small-signal MOSFET Q103, Q104 to which they are connected. That is, the first optoisolator U20 drives the gate of the first small-signal MOSFET Q103 with reference to the source node of the first small-signal MOSFET Q103 and the second optoisolator U21 drives the gate of second small-signal MOSFET Q104 with respect to the source of the second small-signal MOSFET Q104 so that the first and second optoisolators U20, U21 control the activation of the first and second small-signal MOSFETs Q103, Q104 instead of a system composed of a transformer driver, an isolation transformer, and rectifiers as employed in accordance with the embodiment disclosed with reference to FIG. 5. Thus, the complexity of the system is greatly reduced and the operating speed is greatly increased.

High speed digital optoisolators are available from NEC, Agilent, Fairchild, Toshiba and other manufacturers. The optoisolators in accordance with a preferred embodiment of the present invention are selected for their high isolation voltages and fast switching. Using the first and second optoisolators U20, U21 in conjunction with a single power isolation transformer T100 allows for the construction of a system that permits voltage isolation in excess of 5000 volts and allows switching times of less than 100 ns.

The system 510 shown in FIG. 6 operates in the following manner. When the system is unpowered the depletion-mode MOSFET Q102 ensures that Vgs of the first and second power MOSFETs Q100, Q101 remains at 0 volts so that the first and second power MOSFETs Q100, Q101 remain safely turned off. When power is applied to the oscillator circuit 512 the first and second rectifiers 514, 516 charge capacitors C113, C114, C115, C116. The voltage charge on the capacitors C113, C114, C115, C116 forces the depletion-mode MOSFET Q102 into "pinch-off" so that the first and second power MOSFETs Q100, Q101 can be controlled by the first and second small-signal MOSFETs Q103, Q104. The voltage charge on the capacitors C113, C114, C115, C116 is also used to power the isolated output of the first and second optoisolators U20, U21 (power connection not shown for clarity). When the first optoisolator U20 is enabled, the small-signal MOSFET Q103 is rapidly driven into conduction mode so that charge from capacitors C115, C113 is used to charge the gate of the first and second power MOSFETs Q100, Q101. This charging process takes place very rapidly. An inverter U10E ensures that the second optoisolator U21 is disabled whenever the first optoisolator U20 is enabled. To turn off the relay, the enable signal ENBL is inverted so that the second optoisolator U21 activates the small-signal MOSFET Q104 which then allows the negative charge on the capacitors C116, C114 to discharge the gate of the first and second power MOSFETs Q100, Q101 rapidly turning off the first and second power MOSFETs Q100, Q101.

The system 500 disclosed with reference to FIG. 6 uses less components and is extremely fast due to the driving nature of the digital optoisolators and due to the efficiency of utilizing the power stored as voltage charge in the capacitors C113, C114, C115, C116. Zener diodes for protecting the gates of the MOSFETs are not shown in FIG. 6 for clarity. Similarly, the power connections for the output side of the optoisolators are not shown so that the function of the circuit may be explained in more clarity.

Referring once again to FIG. 1, in addition to including the transformers and transformer driving circuitry 22, the control/sensing circuitry 18 includes control voltage sensing circuit 24. The control voltage sensing circuit 24 senses the control voltage to determine when the various MOSFETs making up the relay should be switched on or off. In prior art electromechanical relay systems, this function is accomplished by the pick-up and drop-out characteristics of the relay system coil. In electronic relay systems such as the present MOSFET based electronic relay, the pick-up and drop-out characteristics of the coil must be emulated.

It is currently known to use RMS to DC conversion integrated circuits for the purpose of emulating the pick-up or drop-out characteristics of the coil. Similarly, a simple method of rectifying the AC into a capacitor is well known in the prior art for emulating the pick-up or drop-out characteristics of the coil. However, each of these techniques requires several AC cycles to settle or reach a steady state output. Unfortunately, the present relay requires quicker response and waiting several AC cycles to reach a steady state output is unacceptable.

Figure 7:
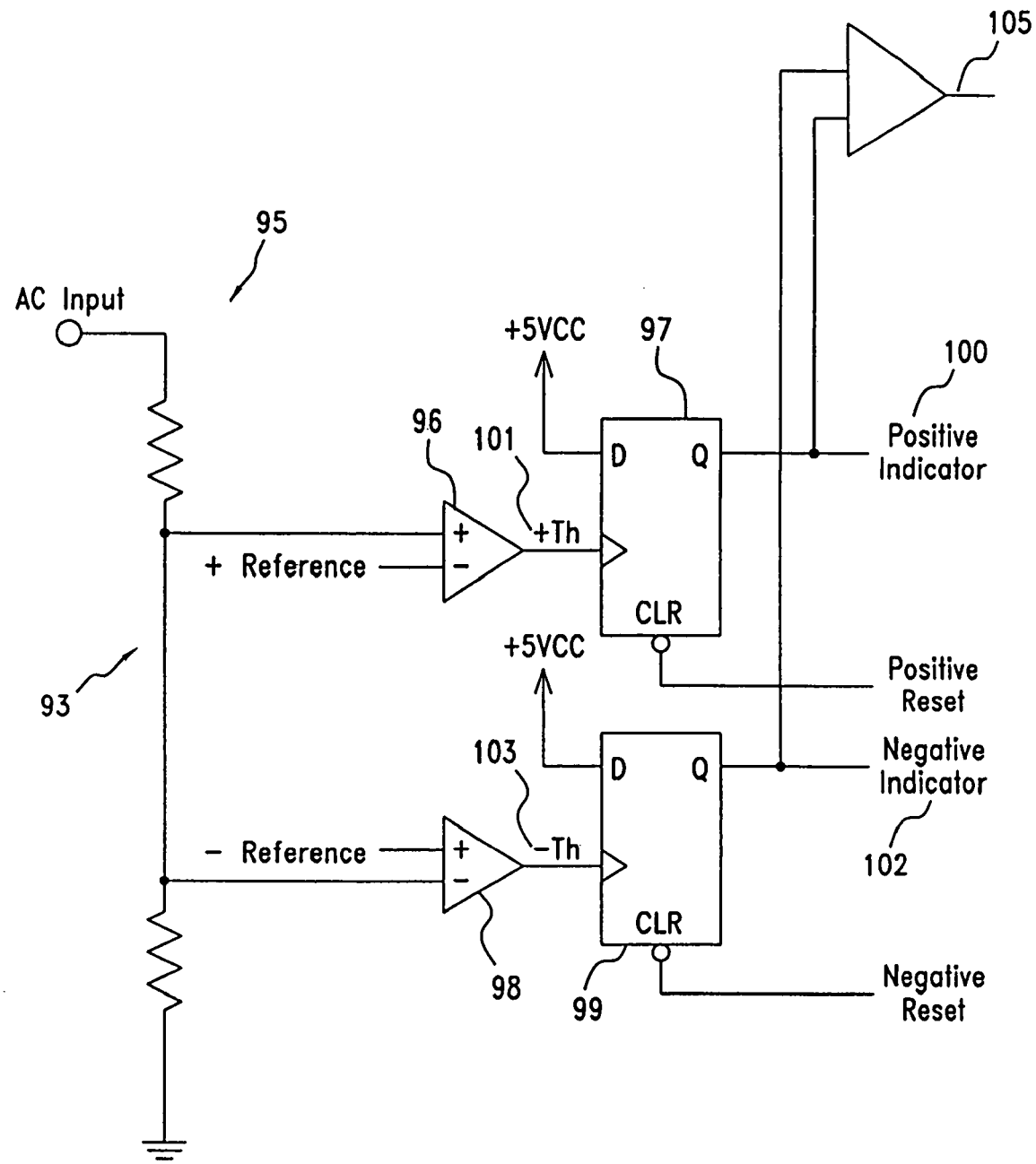
FIG. 7 is a schematic of an AC voltage peak detection circuit.

In an effort to reach a steady state output over a single AC cycle, the present invention utilizes a combination of a digital state machine, digital data traps and analog comparators. For each desired voltage level, two comparators are used. As shown in FIG. 7, a first comparator 96 measures the voltage peak during the positive half cycle of the AC cycle and the second comparator 98 measures the voltage peak during the negative half of the AC cycle. The first and second comparators 96, 98 receive the scaled AC voltage (a voltage scaled by the resistor divider network 93) as inputs to be compared to a positive reference and a negative reference, respectively. The positive reference and negative reference are of equal magnitude, but opposite polarity. Both the first and second comparators output high-voltage when the magnitude of the AC voltage exceeds the predetermined threshold (which is selectively established by operators of the present system). Each of the first and second comparators 96, 98 forces a "set" condition in its respective flip-flop 97, 99 (the set condition being +Th 101 and −Th 103). That is, when either the first or second comparators 96, 98 sense a voltage of greater magnitude than the threshold value, the comparator output goes high, causing a clock event on the flip-flop 97, 99. The flip-flop 97, 99 then registers the logical "1" set by the connection of the data input to VCC. The flip flops 97, 99 in this configuration amount to a digital "trap". That is, a device that traps and holds the data until needed.

Figure 8:
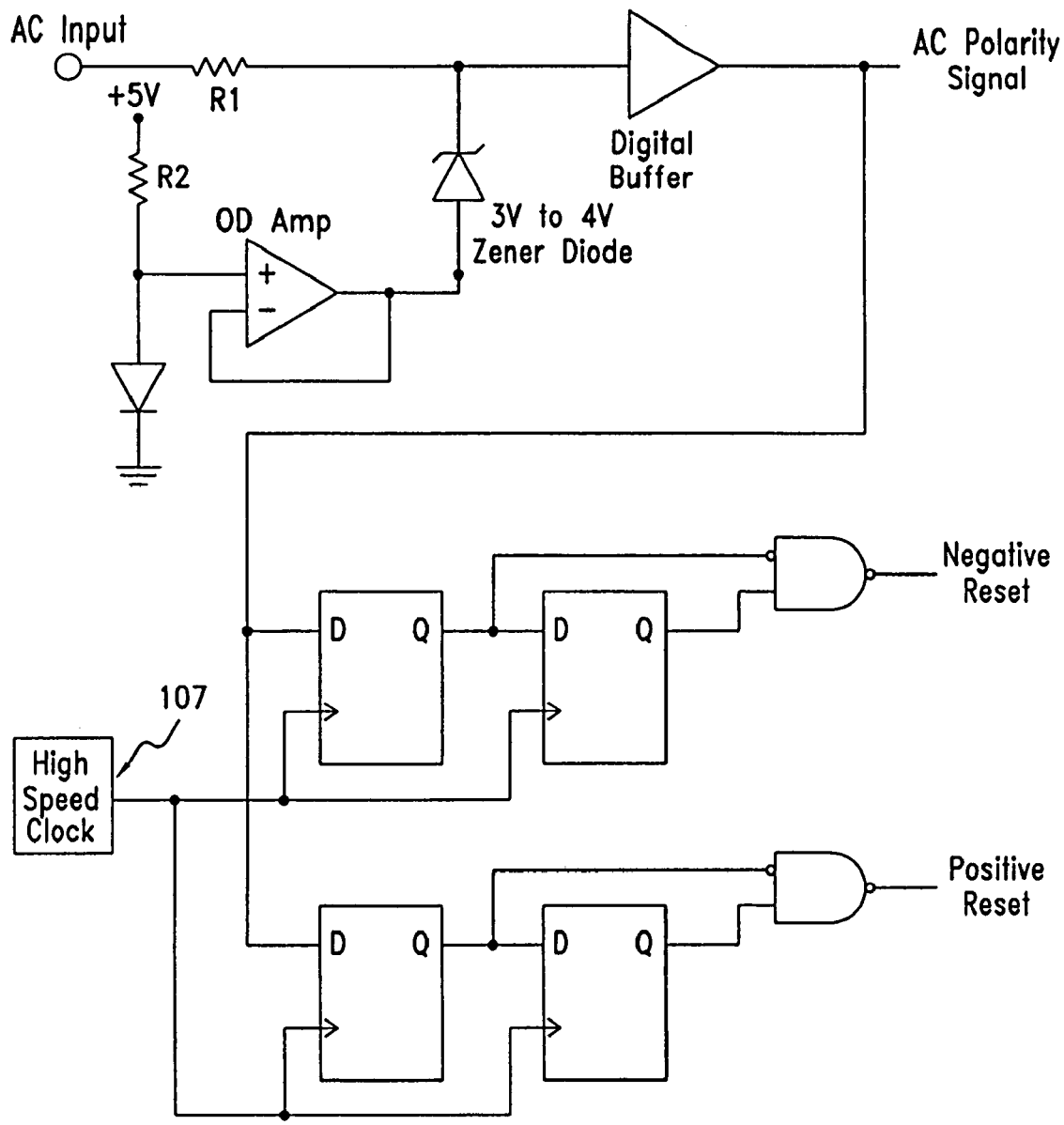
FIG. 8 is a schematic of an AC polarity signal circuit.
Figure 9:
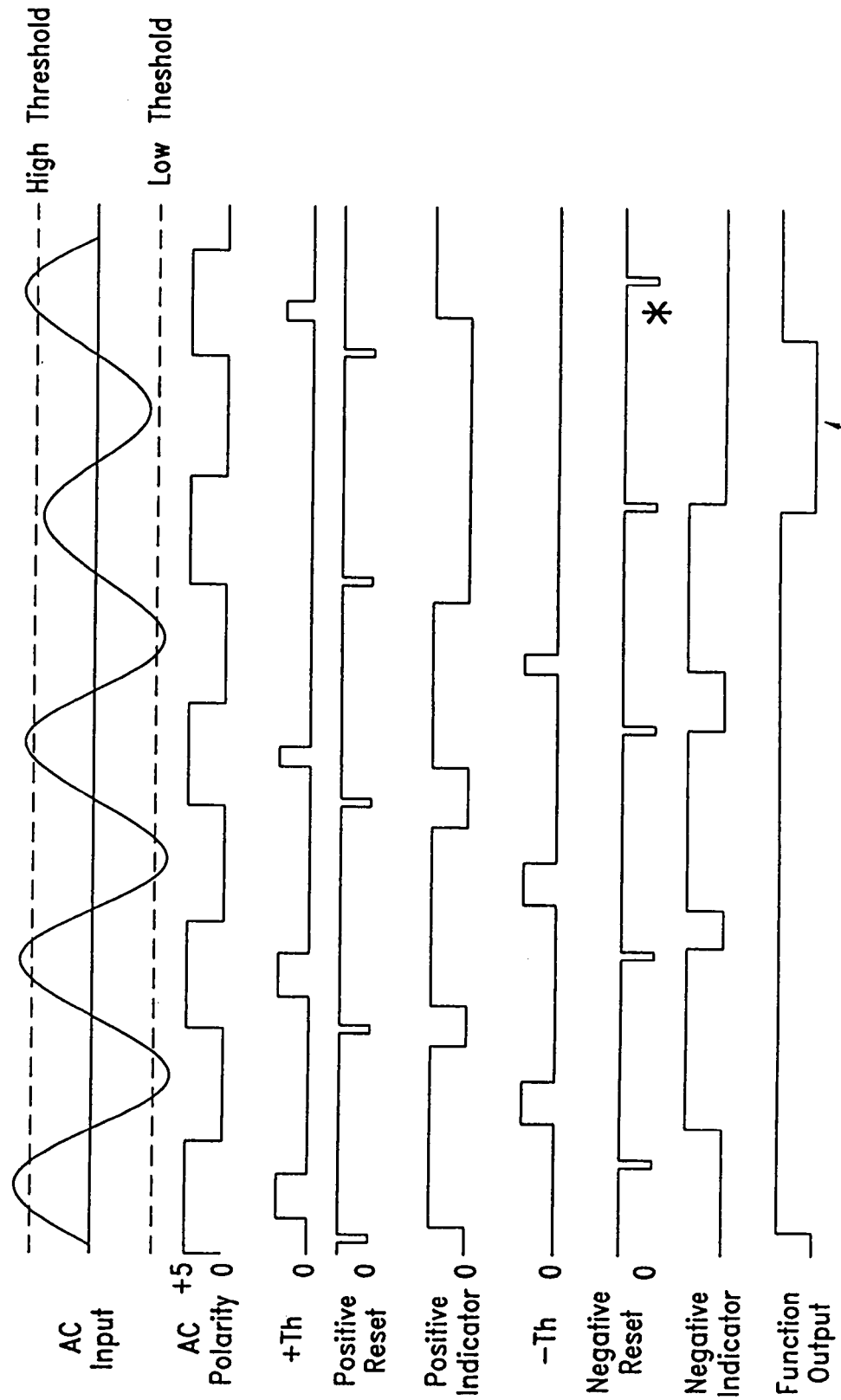
FIG. 9 show various AC voltage waveforms associated with the AC voltage peak detection circuit and AC polarity signal circuit.

The respective positive indicator 100 or negative indicator 102 employed by the first and second comparators 96, 98 of the control voltage sensing circuit 24 remain true until reset by a polarity detection circuit 104 as shown in FIG. 8. Operation of the polarity detection circuit 104 requires the inclusion of a clock 107 that must be run at greater than 120 Hz for 60 Hz power (although other operating speeds are contemplated in accordance with other applications). In utilizing such a polarity detection circuit 104, it is contemplated that it may be necessary to place voltage limiters and analog or digital filters on the +Th 101 and −Th 103 signals before they reach the respective flip-flops of the first and second comparators 96, 98 in order to ensure proper transient conditions. The positive indicator 100 and negative indicator 102 signals are combined by a logical OR to produce a function output signal 105. This signal represents the combined AC threshold and reacts within one AC cycle of threshold crossing. The timing waveforms of the AC power input and the various signals described above and illustrated with reference to FIGS. 7 and 8 are shown in FIG. 9. It is further contemplated that the outputs of the first and second comparators (+Th and −Th) or the positive indicator or negative indicator signals may be input into a digital state machine or microprocessor to allow faster response (for example, ½ AC cycle) and to allow more detailed control functions.

Figure 10:
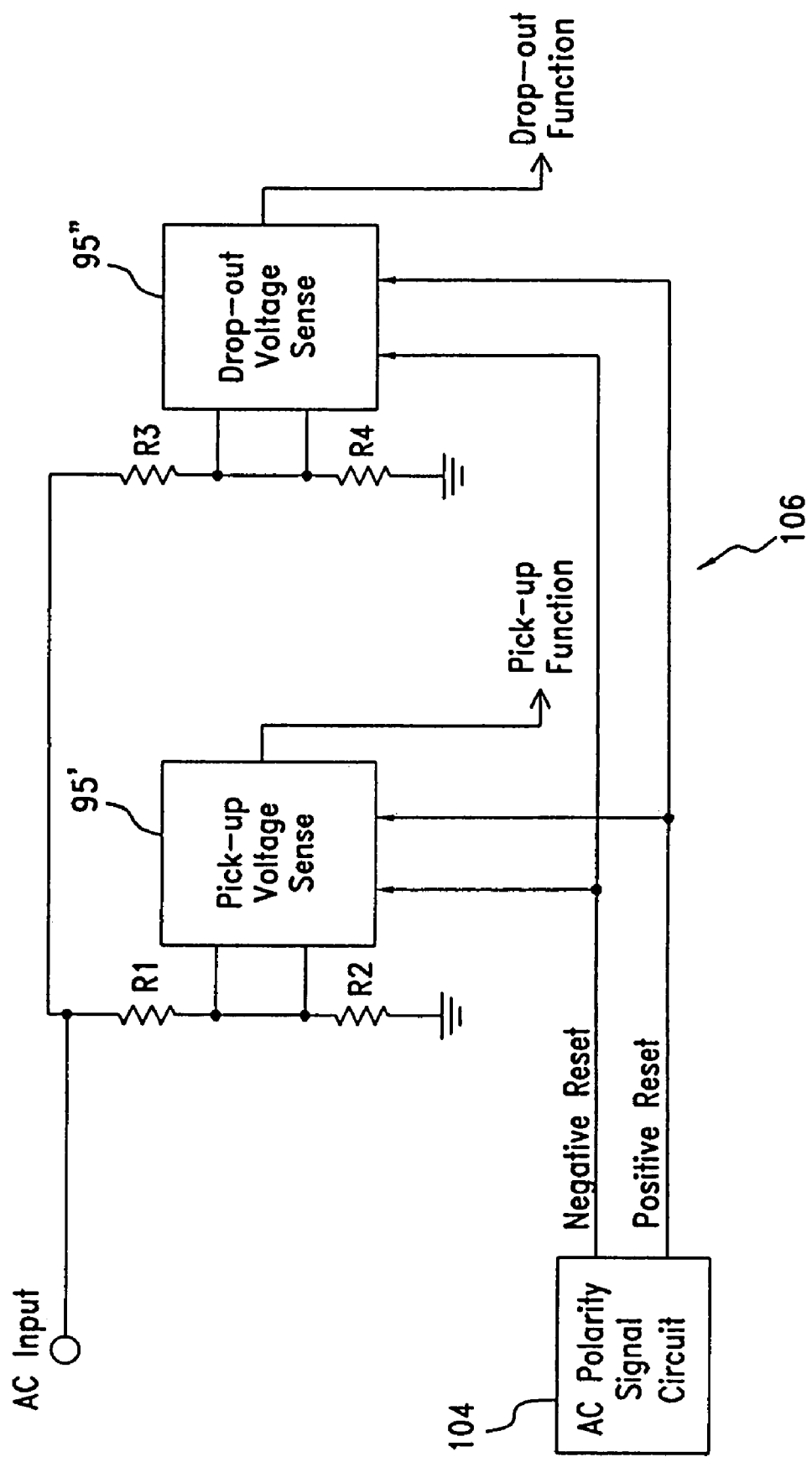
FIG. 10 is a schematic of a two-part dual comparator system.

In order to complete the relay function, a pick-up voltage and a drop-out voltage must both be accounted for. The dual comparator circuit 95 (i.e., first and second comparators 96, 98, as well as the first and second flip flops 97, 99) described above serves to detect one voltage level. Where a system includes a distinct pick-up voltage and a distinct drop-out voltage, two such dual comparator circuits must be used and compared for proper operation. Such a two-part dual comparator system 106 for use in accordance with a preferred embodiment of the present invention is disclosed in FIG. 10. Specifically, FIG. 10 illustrates the combination of two dual comparator circuits 95', 95" to produce both a pick-up function and a drop-out function as required in certain applications of the present invention. The respective pick-up voltage sensor first block (i.e., first dual comparator circuit 95') and drop-out voltage sensor second block (i.e., second dual comparator circuit 95") both contain the same dual comparator circuitry shown in FIG. 10. In addition, both the first block 95' and the second block 95" include either a logical OR gate or a state machine as described previously to produce the proper pick-up or drop-out functions. The only difference between the dual comparator circuits shown in FIG. 10 and those previously described with reference to FIGS. 7 and 8 are the resistor divider networks (R1 and R2, R3 and R4) that serve to select the voltage threshold. The AC polarity signal circuit 104, the same as illustrated in FIG. 14, produces the negative reset and positive reset signals that are shared with all control voltage sensing circuits on that particular AC line.

As those skilled in the art will certainly appreciate, a system may be built with numerous pick-up and drop-out voltage levels as selected by the user. All of the of voltage sensing circuits discussed above share positive and negative reference voltages as well as positive and negative reset signals.

In addition to the transformers, a transformer driving circuitry 22 and control voltage sensing circuits 24, the control/sensing circuitry 18 includes control logic 26. The control logic 26 coordinates all of the activities of the various components of the present relay (whether it is composed of one AC relay block or MOSFET switching circuit or multiple AC relay blocks or MOSFET switching circuits) and performs critical timing of functions.

The first function of the control logic 26 is to determine when the relay should be on or off. In electro-mechanical relays the pick-up voltage is higher than the drop-out voltage. This is a result of the physics of the coil/actuator assembly and offers the advantage of providing the relay with hysteresis that eliminates unstable behavior. In order to emulate this function as provided in electromechanical relays, solid state relays such as the present relay must utilize a state machine to provide the proper control outputs.

Figure 11:
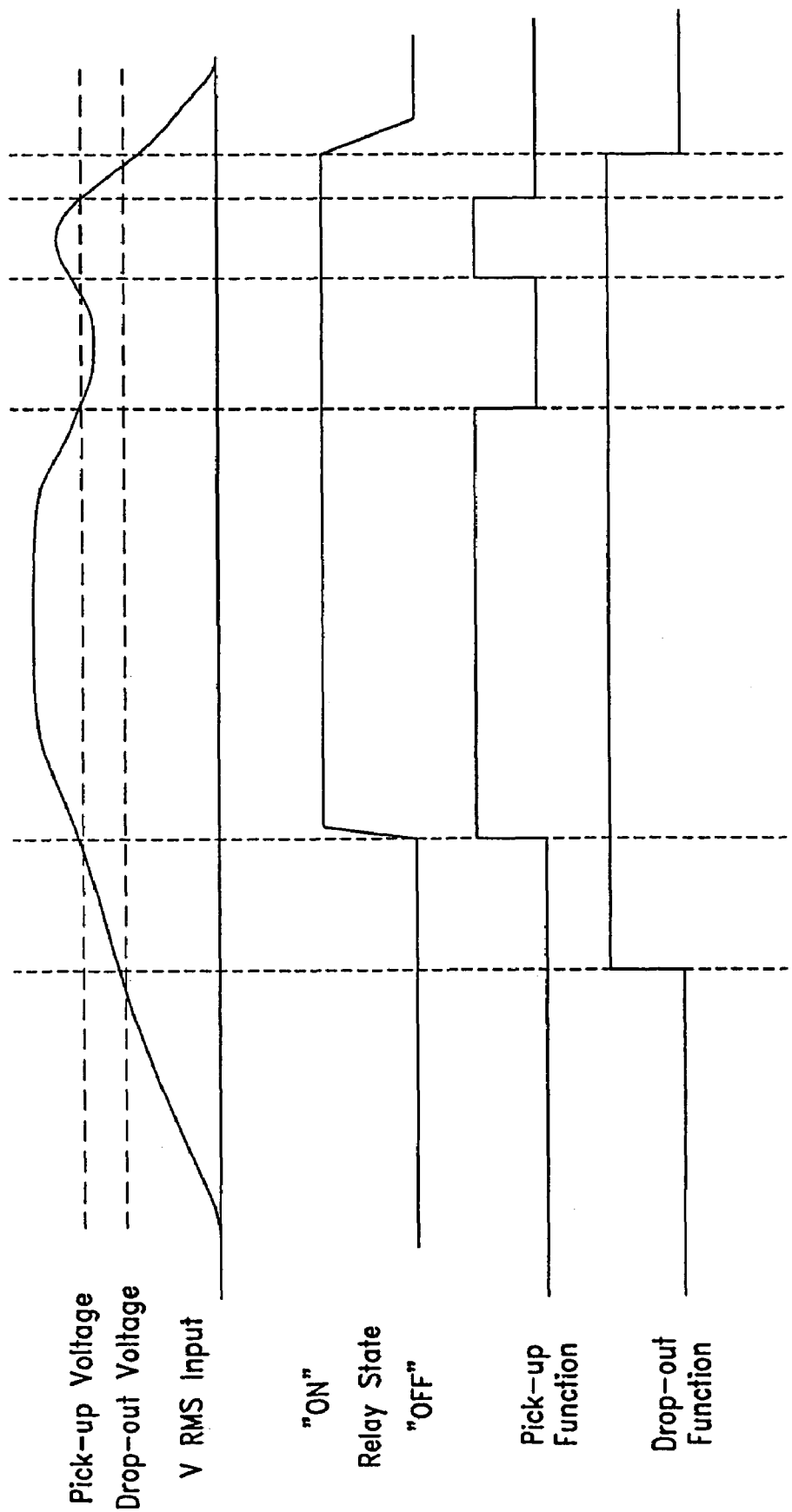
FIG. 11 shows various waveforms associated with the relay state condition in comparison to pick-up and drop-out voltages.
Figure 12:
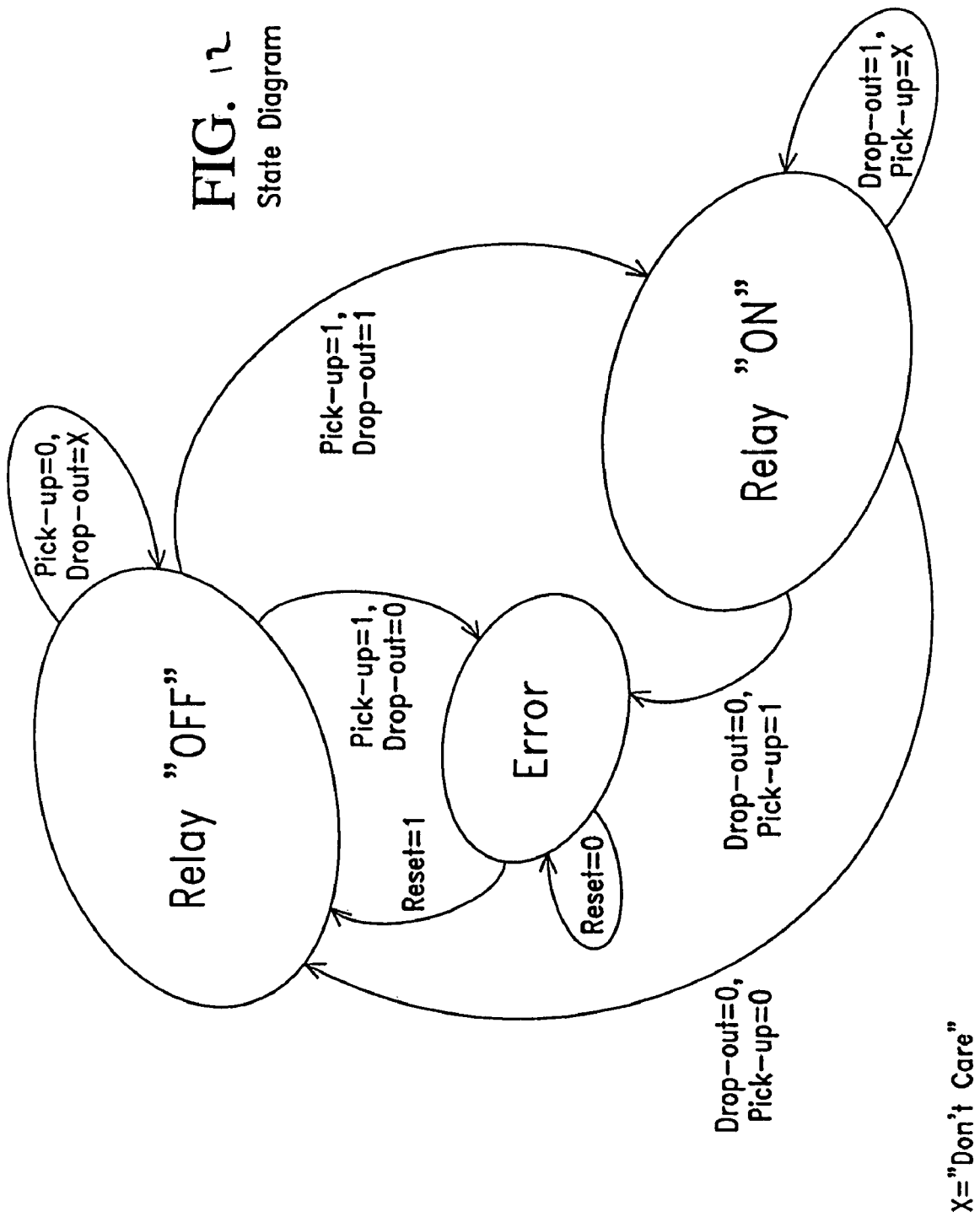
FIG. 12 is a flow diagram of a switching function state machine.
Figure 13:
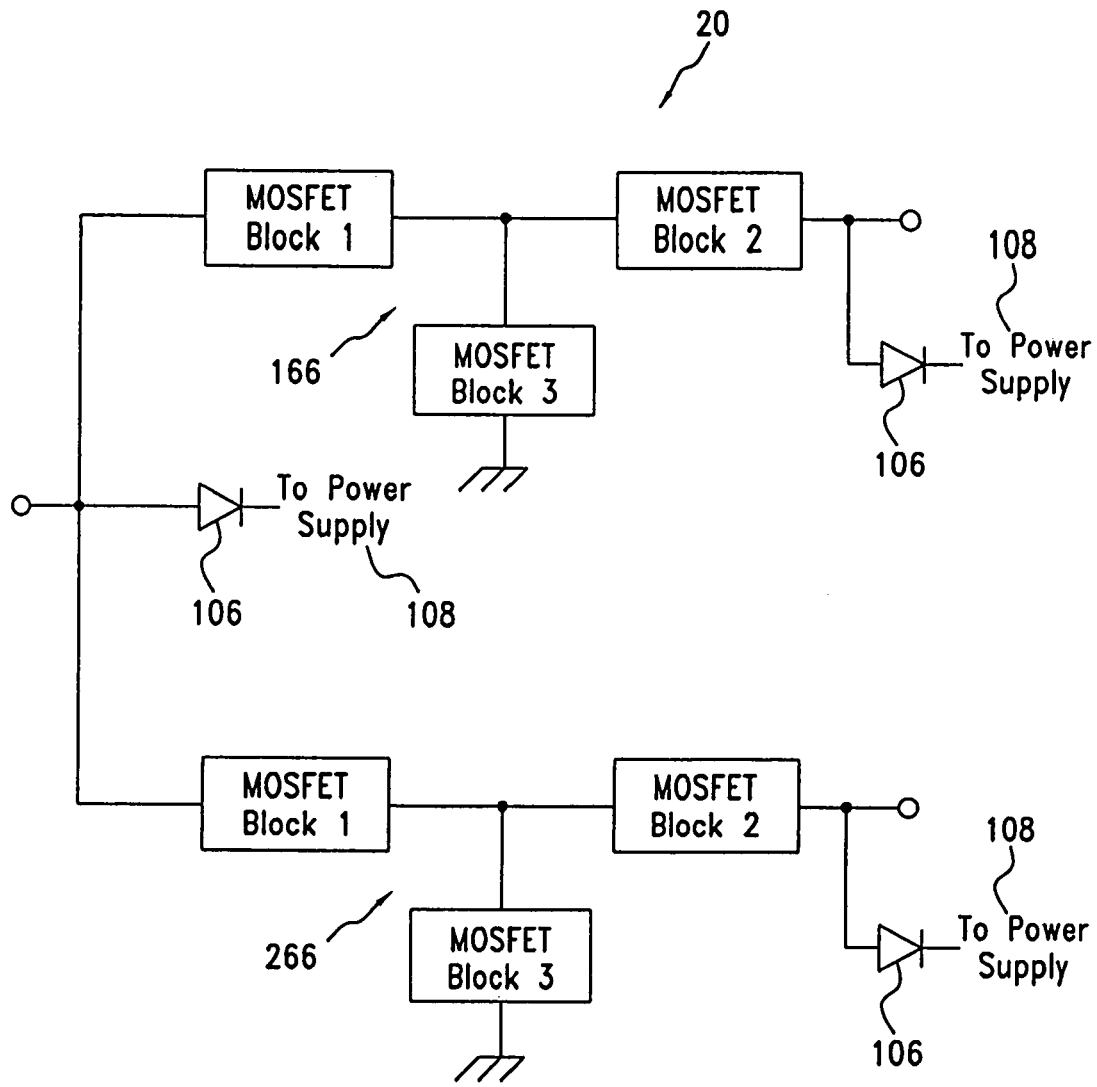
FIG. 13 is a schematic demonstrating the power supply for the present system.
Figure 13A:
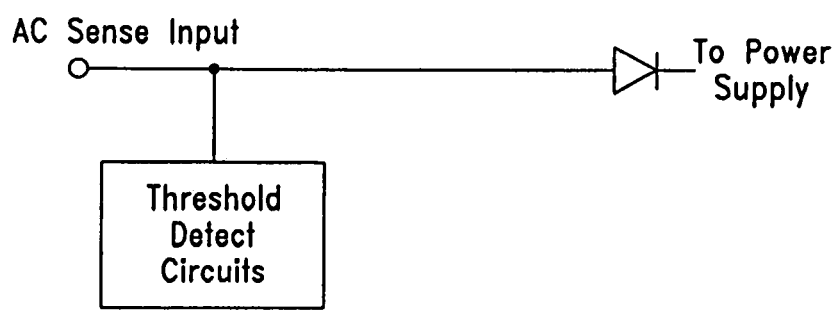
FIG. 13a shows a schematic of an alternate power supply in accordance with the present system.

Referring to FIG. 11, the relationship between the relay condition and the pick-up and drop-out voltages is disclosed. Specifically, the relay is to remain off until the AC voltage reaches the pick-up threshold. Once the pick-up threshold is reached, the relay is to turn on and will not turn off until the AC voltage drops below the drop-out threshold. Since the condition of the relay depends on whether the pick-up threshold has been reached, a state machine or a microprocessor function is required. In accordance with a preferred embodiment of the present invention, a simple three-state state machine is utilized. In accordance with a preferred embodiment, the state machine is realized in programmable logic to perform the control switching function. The logic for such a state machine is disclosed with reference to FIG. 12. As those skilled in the art will certainly appreciate, the state machine may be realized in a microprocessor, in discreet logic, in an ASIC, or by other methods without departing from the spirit of the present invention. The operation of this logic is discussed in greater detail in the parent applications listed above, which is incorporated herein by reference, As previously discussed above, the system requires a power supply 20 for use in energizing all the components utilized in accordance with the present invention. The power supply 20 in accordance with the present invention utilizes off-the-shelf technology with the exception of the diode 106 connected to all AC sources 108 so as to allow the relay and control logic 26 to maintain power when any of the connected AC sources have power. FIG. 13 shows a single diode 106 per power input connected for a double-throw combination of AC relay blocks 166, 266 in accordance with the present invention and the related sensed input. Half-wave and full-wave rectifiers may also be used to perform this function. The use of diodes and rectifiers allows for power if any input has power, without permitting voltage to cross from one terminal to any of the others. Referring to FIG. 13a, power may also be provided with an AC sense input using similar diodes.

While the preferred embodiments have been shown and described, it will be understood that there is no intent to limit the invention by such disclosure, but rather, it is intended to cover all modifications and alternate constructions falling within the spirit and scope of the invention as defined in the appended claims.

The invention claimed is:

1. A driver for a MOSFET based, high voltage, high current electronic relay, wherein the relay includes a MOSFET switching circuit selectively switching between switch conducting and switch isolation, the MOSFET switching circuit including at least one small-signal MOSFET, a depletion-mode MOSFET and at least one power MOSFET, wherein the depletion-mode MOSFET is connected to the at least one power MOSFET to selectively maintain the at least one power MOSFET in non-conducting, the driver comprising:

a driver system coupled to the switching circuit for controlling switching between switch conducting and switch isolation, the driver system including:

a current supply providing a supply of current for actuating the switching circuit; and a transformer arrangement coupled to the current supply for receiving the supply of current from the current supply, the transformer arrangement being adapted for coupling with the switching circuit for selectively applying a predetermined voltage to the switching circuit which establishes the switching circuit in switch conducting or switch isolation; and at least one optoisolator referenced to the at least one small-signal MOSFET for controlling operation of the at least one power MOSFET in controlling the establishment of the switching circuit in switch conducting or switch isolation, wherein the at least one optoisolator drives a gate of the at least one small-signal MOSFET with reference to a source node of the at least one small-signal MOSFET to activate the at least one small-signal MOSFET which in turn controls operation of the at least one power MOSFET.

2. The driver system according to claim 1, further including at least a first rectifier circuit linking the transformer arrangement to the switching circuit.

3. The driver system according to claim 1, wherein the at least one optoisolator drives the gates of the small-signal MOSFET.

4. The driver system according to claim 1, wherein the transformer arrangement includes a first isolation transformer.

5. The driver system according to claim 4, wherein the first isolation transformer includes a primary winding powered by the current supply and a first secondary winding and a second secondary winding adapted for coupling to the switching circuit.

6. The driver system according to claim 5, further including a first full bridge rectifier coupled to the first secondary winding and a second full bridge rectifier coupled to the second secondary winding.

7. The driver system according to claim 1, wherein the current supply is always supplying power to the transformer arrangement during operation of the switching circuit.

8. The driver system according to claim 1, wherein the at least one optoisolator includes a first optoisolator and a second optoisolator, and the first optoisolator is referenced to a first small-signal MOSFET of the switching circuit and the second optoisolator is referenced to a second small-signal MOSFET of the switching circuit.

9. The driver system according to claim 8, wherein the first and second small-signal MOSFETs are respectively connected between gate and source nodes of first and second power MOSFETs of the switching circuit.

10. The driver system according to claim 9, wherein the current supply is always supplying power to the transformer arrangement during operation of the switching circuit.

11. A switching system, comprising:
a MOSFET based, high voltage, high current electronic relay, wherein the relay includes a MOSFET switching circuit selectively switching between switch conducting and switch isolation, the MOSFET switching circuit including at least one small-signal MOSFET a depletion-mode MOSFET and at least one power MOSFET wherein the depletion-mode MOSFET is connected to the at least one power MOSFET to selectively maintain the at least one power MOSFET in non-conducting;
a driver system coupled to the switching circuit for controlling switching between switch conducting and switch isolation, the driver system including:
a current supply providing a supply of current for actuating the switching circuit; and
a transformer arrangement coupled to the current supply for receiving the supply of current from the current supply and the switching circuit for selectively applying a predetermined voltage to the switching circuit which establishes the switching circuit in switch conducting or switch isolation;
at least one optoisolator referenced to the at least one small-signal MOSFET for controlling operation of the at least one power MOSFET in controlling the establishment of the switching circuit in switch conducting or switch isolation, wherein the at least one optoisolator drives a gate of the at least one small-signal MOSFET with reference to a source node of the at least one small-signal MOSFET to activate the at least one small-signal MOSFET which in turn controls operation of the at least one power MOSFET.

12. The switching system according to claim 11, further including at least a first rectifier circuit linking the transformer arrangement to the switching circuit.

13. The driver system according to claim 11, wherein the at least one optoisolator drives the gates of the small-signal MOSFET.

14. The switching system according to claim 11, wherein the transformer arrangement includes a first isolation transformer.

15. The switching system according to claim 11, wherein the current supply is always supplying power to the transformer arrangement during operation of the switching circuit.

16. The switching system according to claim 11, wherein the at least one optoisolator includes a first optoisolator and a second optoisolator, and the first optoisolator is referenced to a first small-signal MOSFET of the switching circuit and the second optoisolator is referenced to a second small-signal MOSFET of the switching circuit.

17. The switching system according to claim 16, wherein the first and second small-signal MOSFETs are respectively connected between gate and source nodes of first and second power MOSFETs.

18. The switching system according to claim 17, wherein the current supply is always supplying power to the transformer arrangement during operation of the switching circuit.

19. The driver according to claim 1, further including at least one capacitor which powers the at least one optoisolator., the at least one capacitor forcing the depletion-mode MOSFET off upon charging thereof.

20. The switching system according to claim 11, further including at least one capacitor which powers the at least one optoisolator, the at least one capacitor forcing the depletion-mode MOSFET off upon charging thereof.

21. A driver for a MOSFET based, high voltage, high current electronic relay, wherein the relay includes a MOSFET switching circuit selectively switching between switch conducting and switch isolation, the MOSFET switching circuit including at least one small-signal MOSFET and at least one power MOSFET, the driver comprising:
a driver system coupled to the switching circuit for controlling switching between switch conducting and switch isolation, the driver system including:
a current supply providing a supply of current for actuating the switching circuit; and
a transformer arrangement coupled to the current supply for receiving the supply of current from the current supply, the transformer arrangement being adapted for coupling with the switching circuit for selectively applying a predetermined voltage to the switching circuit which establishes the switching circuit in switch conducting or switch isolation; and
at least one optoisolator referenced to the at least one small-signal MOSFET for controlling operation of the at least one power MOSFET in controlling the establishment of the switching circuit in switch conducting or switch isolation, wherein the at least one optoisolator includes a first optoisolator and a second optoisolator, and the first optoisolator is referenced to a first small-signal MOSFET of the switching circuit and the second optoisolator is referenced to a second small-signal MOSFET of the switching circuit, and wherein the first and second small-signal MOSFETs are respectively connected between gate and source nodes of first and second power MOSFETs of the switching circuit.

22. A switching system, comprising:

a MOSFET based, high voltage, high current electronic relay, wherein the relay includes a MOSFET switching circuit selectively switching between switch conducting and switch isolation, the MOSFET switching circuit including at least one small-signal MOSFET and at least one power MOSFET;

a driver system coupled to the switching circuit for controlling switching between switch conducting and switch isolation, the driver system including:

a current supply providing a supply of current for actuating the switching circuit; and a transformer arrangement coupled to the current supply for receiving the supply of current from the current supply and the switching circuit for selectively applying a predetermined voltage to the switching circuit which establishes the switching circuit in switch conducting or switch isolation;

at least one optoisolator referenced to the at least one small-signal MOSFET for controlling operation of the at least one power MOSFET in controlling the establishment of the switching circuit in switch conducting or switch isolation, wherein the at least one optoisolator includes a first optoisolator and a second optoisolator, and the first optoisolator is referenced to a first small-signal MOSFET of the switching circuit and the second optoisolator is referenced to a second small-signal MOSFET of the switching circuit, wherein the first and second small-signal MOSFETs are respectively connected between gate and source nodes of first and second power MOSFETs.

* * * * *

UNITED STATES PATENT AND TRADEMARK OFFICE
CERTIFICATE OF CORRECTION

| | |
|---|---|
| PATENT NO. | : 7,439,636 B2 |
| APPLICATION NO. | : 11/702535 |
| DATED | : October 21, 2008 |
| INVENTOR(S) | : James M. Lewis |

It is certified that error appears in the above-identified patent and that said Letters Patent is hereby corrected as shown below:

In the Specification

Col. 1, line 29, insert the following:

-- This invention was made with government support under N65540-03-C-0025 awarded by the Department of Defense. The government has certain rights in the invention. --

Signed and Sealed this
Sixth Day of August, 2013

Teresa Stanek Rea
*Acting Director of the United States Patent and Trademark Office*